(12) United States Patent
Kang et al.

(10) Patent No.: US 12,490,436 B2
(45) Date of Patent: Dec. 2, 2025

(54) METHOD OF MANUFACTURING SEMICONDUCTOR DEVICE COMPRISING DOPING ELEMENT IN THE CHARGE STORAGE LAYER

(71) Applicant: Samsung Electronics Co., Ltd., Suwon-si (KR)

(72) Inventors: Minkyung Kang, Seoul (KR); Suhyeong Lee, Hwaseong-si (KR); Seohee Park, Daejeon (KR); Gukhyon Yon, Yongin-si (KR); Yongsuk Tak, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 420 days.

(21) Appl. No.: 18/047,109

(22) Filed: Oct. 17, 2022

(65) Prior Publication Data

US 2023/0209825 A1    Jun. 29, 2023

(30) Foreign Application Priority Data

Oct. 18, 2021 (KR) .......................... 10-2021-0138837

(51) Int. Cl.
*H10B 43/27* (2023.01)
*H10B 43/35* (2023.01)

(52) U.S. Cl.
CPC .............. *H10B 43/27* (2023.02); *H10B 43/35* (2023.02)

(58) Field of Classification Search
CPC . H01L 27/1027; H01L 27/1028; H10B 53/00; H10B 53/10; H10B 53/20; H10B 53/30; H10B 53/40; H10B 53/50; H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10; H10B 43/20; H10B 43/23; H10B 43/27; H10B 43/30; H10B 43/35;
(Continued)

(56) References Cited

U.S. PATENT DOCUMENTS 9,437,607 B2    9/2016  Park et al.
9,515,086 B2   12/2016  Yon et al.
(Continued)

FOREIGN PATENT DOCUMENTS

KR        101018710 B1     3/2011
KR       20140033939 A      3/2014
(Continued)

*Primary Examiner* — William B Partridge
*Assistant Examiner* — Gustavo G Ramallo
(74) *Attorney, Agent, or Firm* — Wolf, Greenfield & Sacks, P.C.

(57) ABSTRACT

Provided is a method of manufacturing a semiconductor device, the method including: forming a mold structure comprising insulation layers and sacrificial layers alternately and repeatedly stacked on a substrate; forming a channel hole extending through the mold structure; forming a blocking layer in the channel hole; forming a charge storage layer on the blocking layer; forming a tunnel insulation layer including a doping element on the charge storage layer; performing heat treatment to diffuse the doping element from the tunnel insulation layer to the charge storage layer; and forming a channel layer on the tunnel insulation layer.

14 Claims, 24 Drawing Sheets

(58) Field of Classification Search
CPC ........ H10B 43/40; H10B 43/50; H10B 51/00; H10B 51/10; H10B 51/20; H10B 51/30; H10B 51/40; H10B 51/50
See application file for complete search history.

(56) References Cited

U.S. PATENT DOCUMENTS

| | | |
|---|---|---|
| 9,882,018 B2 | 1/2018 | Noh et al. |
| 10,355,099 B2 | 7/2019 | Choi et al. |
| 10,453,707 B2 | 10/2019 | Cho et al. |
| 10,680,006 B2 | 6/2020 | Carlson |
| 2004/0198069 A1 | 10/2004 | Metzner et al. |
| 2006/0240623 A1* | 10/2006 | Lee ................ H10D 30/69 438/257 |
| 2007/0210368 A1* | 9/2007 | Cho ................ H10B 69/00 257/314 |
| 2008/0237688 A1* | 10/2008 | Yasuda ............ H10D 64/685 257/E21.21 |
| 2011/0101443 A1* | 5/2011 | Huo ................ H10D 30/683 257/324 |
| 2011/0266611 A1* | 11/2011 | Kim ................ H10D 30/693 257/E21.21 |
| 2015/0255479 A1* | 9/2015 | Sakuma ............ H01L 21/311 257/316 |
| 2017/0077115 A1* | 3/2017 | Ino ................ H10D 64/037 |
| 2017/0084748 A1* | 3/2017 | Yang ................ H10B 41/30 |

FOREIGN PATENT DOCUMENTS

| | | |
|---|---|---|
| KR | 20160049159 A | 5/2016 |
| KR | 20180137720 A | 12/2018 |
| KR | 102091724 B1 | 3/2020 |

\* cited by examiner

| | OPTIMAL CONCENTRATION | DEEP TRAP DENSITY (RATIO AGAINST REF) |
|---|---|---|
| Ref | 0 | 100% |
| La | 0~3% | 132% |
| Al | 0~4% | 178% |
| Ti | 0~3% | 146% |
| Hf | 0~5% | 231% |

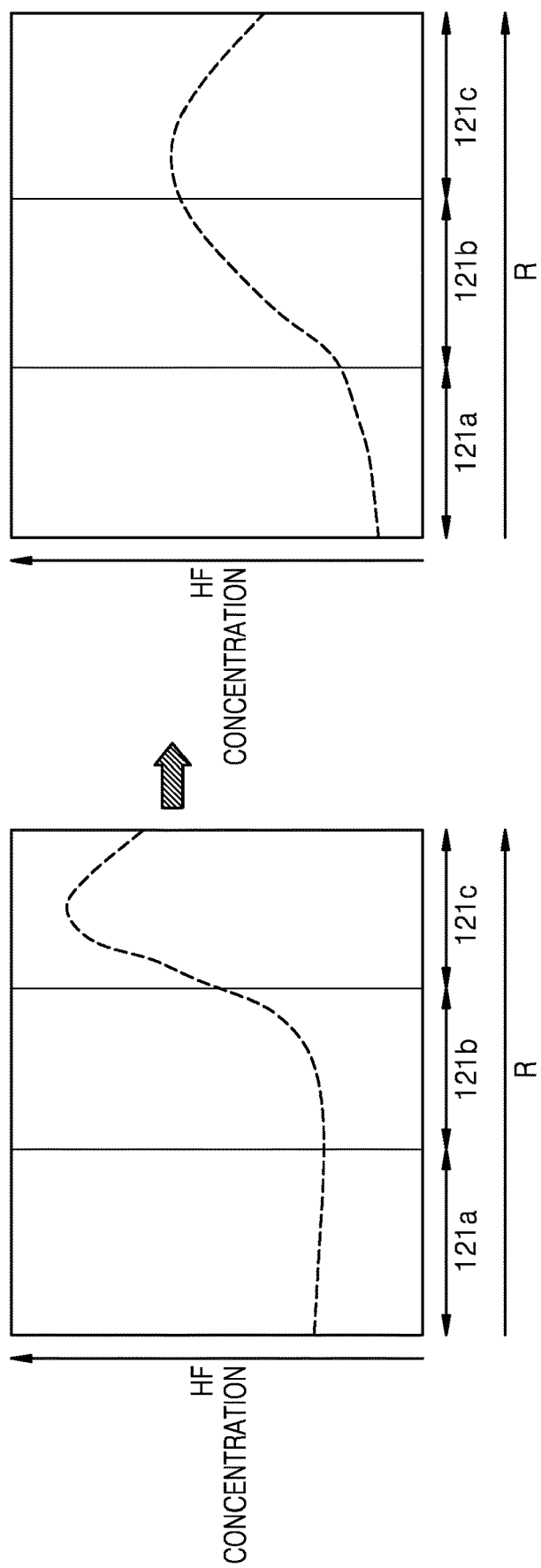

METHOD OF MANUFACTURING SEMICONDUCTOR DEVICE COMPRISING DOPING ELEMENT IN THE CHARGE STORAGE LAYER

CROSS-REFERENCE TO RELATED APPLICATION

This application is based on and claims priority under 35 U.S.C. § 119 to Korean Patent Application No. 10-2021-0138837, filed on Oct. 18, 2021, in the Korean Intellectual Property Office, the disclosure of which is incorporated by reference herein in its entirety.

BACKGROUND

The inventive concept relates to a method of manufacturing a semiconductor device, and more particularly, to a method of manufacturing a 3-dimensional semiconductor memory device.

A semiconductor memory device is a memory device implemented by using a semiconductor. Semiconductor memory devices are largely divided into volatile memory devices and non-volatile memory devices. A non-volatile memory device is a memory device that retains stored data even when power supply is cut off. Meanwhile, along with rapid developments in the electronics industry, there is demand for a semiconductor device capable of storing high-capacity data. Accordingly, methods for increasing data storage capacity of a semiconductor device are being researched. As one of the methods, a semiconductor device including 3-dimensionally arranged memory cells instead of 2-dimensionally arranged memory cells has been proposed.

SUMMARY

The inventive concept provides a semiconductor device having improved characteristics and improved reliability.

According to an aspect of the inventive concept, there is provided a method of manufacturing a semiconductor device, the method including: forming a mold structure comprising insulation layers and sacrificial layers alternately and repeatedly stacked on a substrate; forming a channel hole extending through the mold structure; forming a blocking layer in the channel hole; forming a charge storage layer on the blocking layer; forming a tunnel insulation layer including a doping element on the charge storage layer; performing heat treatment to diffuse the doping element from the tunnel insulation layer to the charge storage layer; and forming a channel layer on the tunnel insulation layer.

According to another aspect of the inventive concept, there is provided a method of manufacturing a semiconductor device, the method including: forming a mold structure comprising insulation layers and sacrificial layers alternately and repeatedly stacked on a substrate; forming a channel hole extending through the mold structure; forming a channel layer on the channel hole; removing the sacrificial layers; forming a tunnel insulation layer including a doping element on the insulation layers; forming a charge storage layer on the tunnel insulation layer; performing a heat treatment to diffuse the doping element from the tunnel insulation layer to the charge storage layer; forming a blocking layer on the charge storage layer; and forming a gate electrode on the blocking layer.

According to another aspect of the inventive concept, there is provided a method of manufacturing a semiconductor device, the method including: forming a mold structure comprising insulation layers and sacrificial layers alternately and repeatedly stacked on a substrate; forming a channel hole extending through the mold structure; forming a channel structure in the channel hole; removing the sacrificial layers; and forming gate electrodes in spaces from which the sacrificial layers are removed, wherein the forming of the channel structure includes forming a blocking layer in the channel hole; forming a charge storage layer on the blocking layer; forming a tunnel insulation layer including a doping element on the charge storage layer; performing heat treatment to diffuse the doping element from the tunnel insulation layer to the charge storage layer; and forming a channel layer on the tunnel insulation layer.

BRIEF DESCRIPTION OF THE DRAWINGS

Embodiments of the inventive concept will be more clearly understood from the following detailed description taken in conjunction with the accompanying drawings in which:

FIG. 7 is a diagram showing a change in concentration of a doping element due to heat treatment, according to an example embodiment of the inventive concept;

DETAILED DESCRIPTION OF THE EMBODIMENTS

Figure 1:
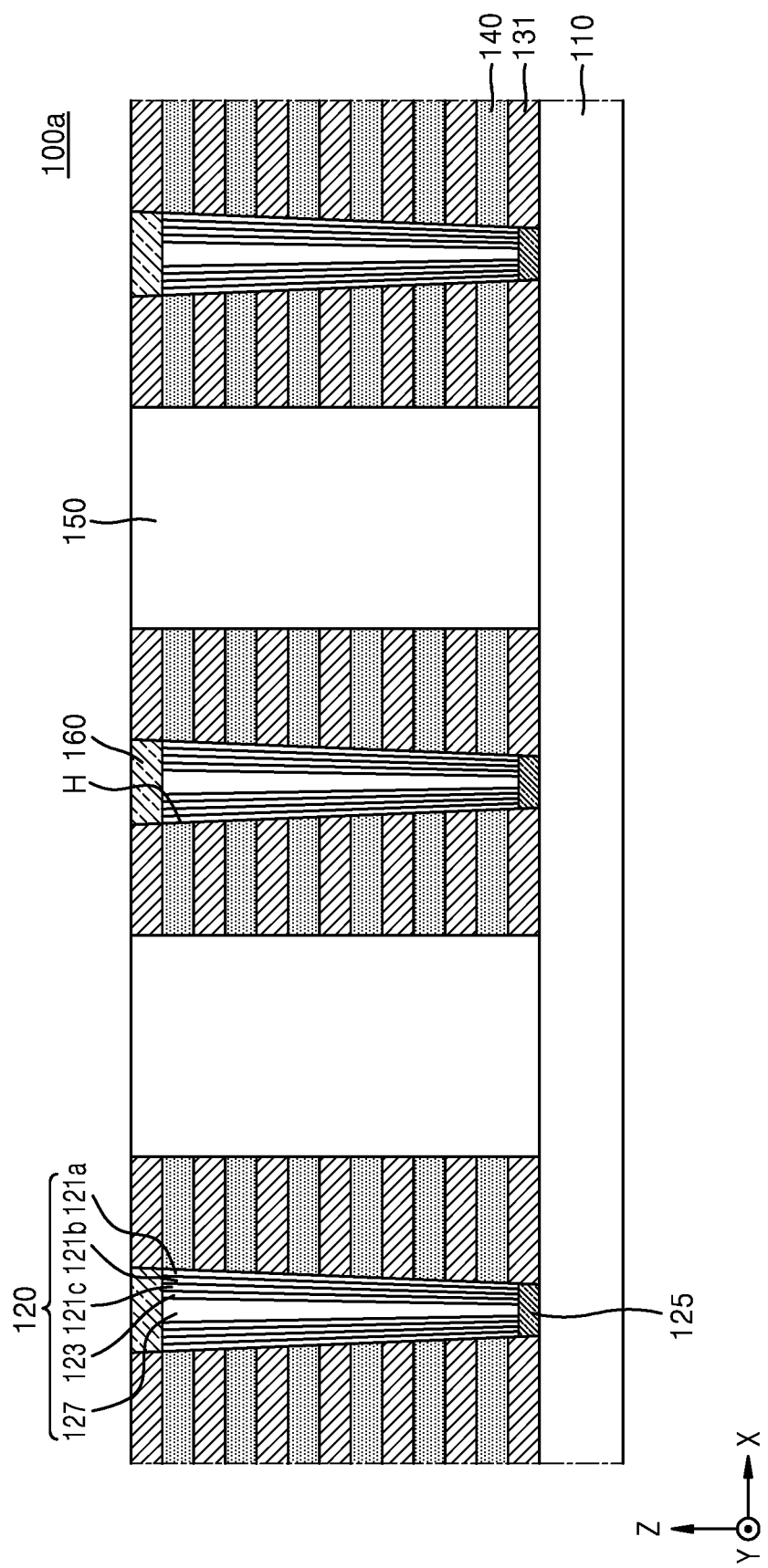
FIG. 1 is a schematic cross-sectional view of a semiconductor device according to an example embodiment of the inventive concept.
Figure 2:
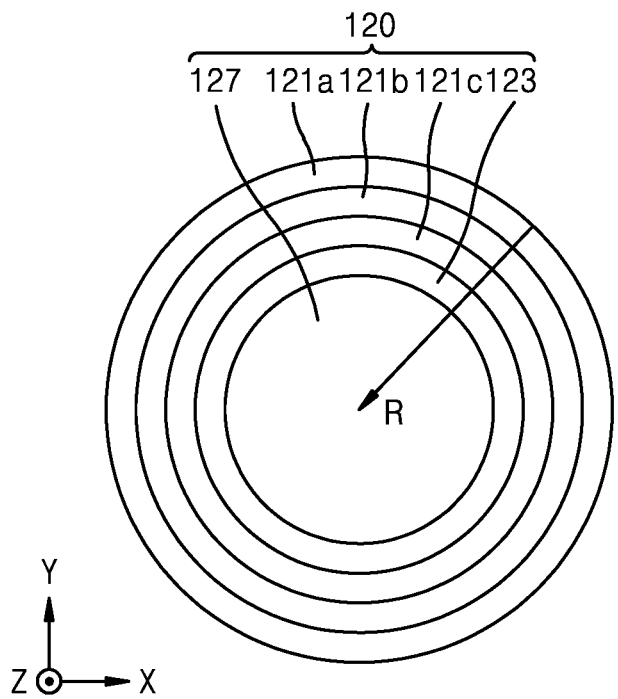
FIG. 2 is a plan view of a channel structure according to an example embodiment of the inventive concept.

FIG. 1 is a schematic cross-sectional view of a semiconductor device according to example embodiments of the inventive concept. FIG. 2 is a plan view of a channel structure according to an example embodiment of the inventive concept.

Referring to FIGS. 1 and 2, a semiconductor device 100a includes a substrate 110, a plurality of channel structures 120 extending in a vertical direction (Z direction) on the substrate 110, a plurality of insulation layers 131 and a plurality of gate electrodes 140 alternately and repeatedly stacked along outer walls of the channel structures 120, and a device isolation layer 150 positioned to isolate the gate electrodes 140 at regular intervals. Although not shown, the semiconductor device 100a may further include an upper wiring structure, e.g., bit lines. In the semiconductor device 100a, one memory cell string may be configured around each channel structure 120, and a plurality of memory cell strings may be arranged in columns and rows in a first horizontal direction (X direction) and a second horizontal direction (Y direction).

The substrate 110 may have a top surface extending on an X-Y plane. The substrate 110 may include a group IV semiconductor like silicon (Si) or germanium (Ge), a group IV-IV compound semiconductor like silicon-germanium (SiGe) or silicon carbide (SiC), or a group III-V compound semiconductor like gallium arsenide (GaAs), indium arsenide (InAs), or indium phosphorus (InP). The substrate 110 may be provided as a bulk wafer, an epitaxial layer, a silicon on insulator (SOI) layer, etc.

The channel structures 120 may be arranged in channel holes H extending through the insulation layers 131 and the gate electrodes 140. The channel structures 120 may be arranged regularly on the substrate 110. For example, the channel structures 120 may be regularly arranged at regular intervals in the first horizontal direction (X direction) and the second horizontal direction (Y direction) perpendicular to the first horizontal direction (X direction). However, the inventive concept is not limited thereto, and the channel structures 120 may be arranged in other configurations, for example, in a zigzag shape in one direction.

A sidewall of each of the channel structures 120 may have a tapered shape in which the length of a channel structure 120 in the first horizontal direction (X direction) decreases in a direction from one end of the channel structure 120 to the other end, but the inventive concept is not limited thereto. For example, unlike as shown in FIG. 1, sidewalls of the channel structures 120 may have a substantially vertical profile.

As shown in FIG. 2, the channel structures 120 may each have a circular or elliptical cross-section on the X-Y plane. The channel structures 120 may each include a blocking layer 121a, a charge storage layer 121b, a tunnel insulation layer 121c, a channel layer 123, and a channel insulation layer 127 in the order stated in a direction (R direction) from the outside of a circle or an ellipse toward the center of the circle or the ellipse on the X-Y plane. Also, as shown in FIG. 1, the channel structures 120 may each include a channel pad 125 positioned at an end of a channel hole H.

The blocking layer 121a may be on the sidewall of the channel hole H. The blocking layer 121a may include, for example, silicon oxide (SiO$_2$), silicon nitride (Si$_3$N$_4$), silicon oxynitride (SiON), or a combination thereof. Unlike as shown in FIG. 1, the blocking layer 121a may include a plurality of layers.

The blocking layer 121a may reduce or prevent charges stored in the charge storage layer 121b from being discharged to the gate electrode 140. Although not shown in FIG. 1, a barrier metal layer may be between the sidewall of the channel hole H and the blocking layer 121a. The barrier metal layer may include, for example, titanium nitride (TiN). The barrier metal layer may help the outer wall of the blocking layer 121a to adhere well to the sidewall of the channel hole H.

The charge storage layer 121b may be on the blocking layer 121a. The charge storage layer 121b may be on the inner wall of the blocking layer 121a. The bottom surface of the charge storage layer 121b may be in contact with the top surface of the substrate 110.

The charge storage layer 121b may include at least one doping element to form a deep level trap. A doping element may be a dopant or impurity. In an example embodiment, the doping element may include at least one of hafnium (Hf), aluminum (Al), lanthanum (La), zirconium (Zr), and titanium (Ti), but is not limited thereto.

The charge storage layer 121b may include, for example, hafnium silicon nitride (HfSiN) or hafnium silicon oxynitride (HfSiON) but is not limited thereto. In an example embodiment, the length of the charge storage layer 121b in the first horizontal direction (X direction) may be from about 40 Å to about 80 Å. For example, the length of the charge storage layer 121b in the first horizontal direction (X direction) may be about 60 Å. Unlike as shown in FIG. 1, the charge storage layer 121b may include a plurality of layers. In an example embodiment, the concentration of the doping element included in the charge storage layer 121b may be less than or equal to about 5% of the concentration of all elements included in the charge storage layer 121b. For example, when the charge storage layer 121b includes Hf, the concentration of Hf included in the charge storage layer 121b may be about 5%.

Figure 3:
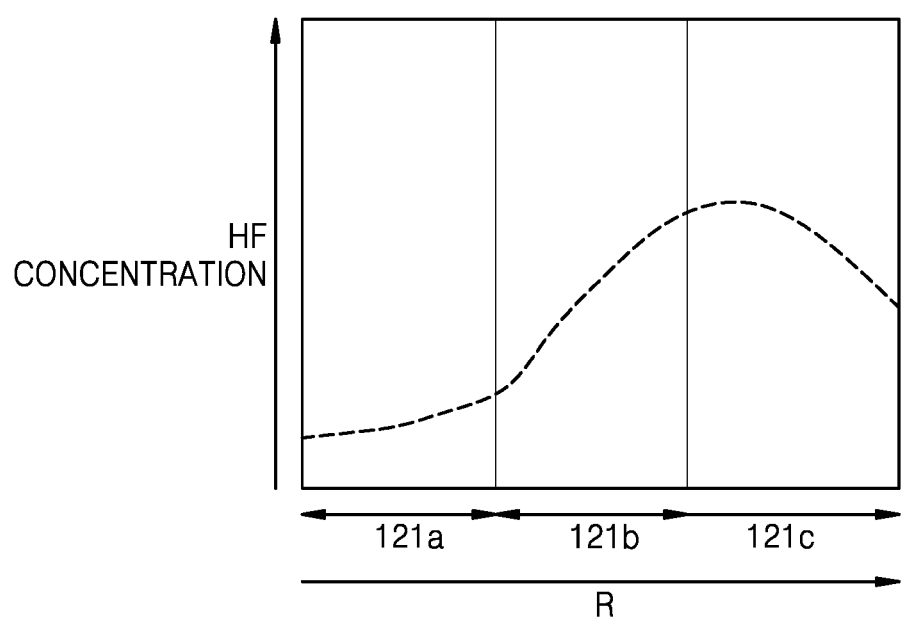
FIG. 3 is a diagram showing the concentration of hafnium in a channel structure according to an example embodiment of the inventive concept.

FIG. 3 is a diagram showing the concentration of Hf in a channel structure according to an example embodiment of the inventive concept.

Referring to FIGS. 1 to 3, in an example embodiment, the concentration of the doping element included in the charge storage layer 121b may be highest at one side of the charge storage layer 121b and may gradually decrease toward the opposite side of the charge storage layer 121b. For example, when the charge storage layer 121b includes Hf, the concentration of Hf included in the charge storage layer 121b may be highest at one side of the charge storage layer 121b in contact with the tunnel insulation layer 121c and may gradually decrease toward the opposite side of the charge storage layer 121b in contact with the blocking layer 121a.

The charge storage layer 121b may have various trap levels. From among the various trap levels, a shallow level trap is a trap close to a valence band (VB) or a conduction band (CB), and a deep level trap is a trap far from the VB or the CB, that is, a trap close to a center point between the CB and the VB.

Figures 4, 5:
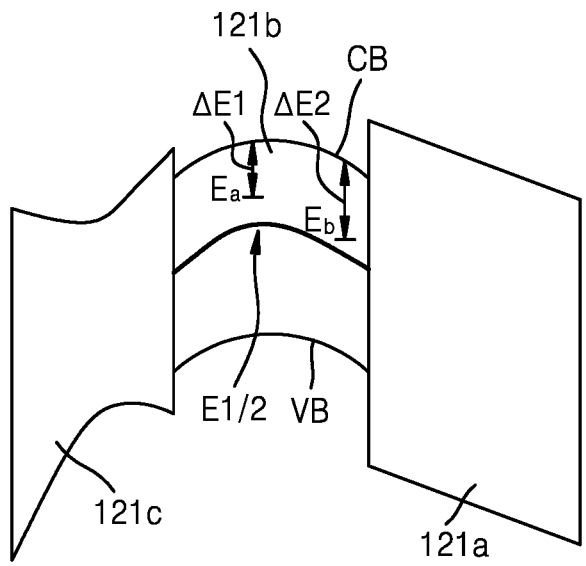
FIG. 4 is a band diagram for describing the charge storage characteristics of a semiconductor device according to an example embodiment of the inventive concept.
FIG. 5 is a diagram showing deep level trap densities according to doping elements, according to an example embodiment of the inventive concept.

FIG. 4 is a band diagram for describing the charge storage characteristics of a semiconductor device according to an example embodiment of the inventive concept.

Referring to FIG. 4, a shallow level trap Ea may be located relatively closer to a CB than a deep level trap Eb. On the other hand, the deep level trap Eb may be located relatively close to an intermediate energy level $E_{1/2}$ between the CB and the VB as compared to the shallow level trap Ea. For example, the shallow level trap Ea may be located at a depth of about 1.0 ev or less, and the deep level trap Eb may be located at a depth from about 1.0 ev to about 3.5 ev.

In the case of the shallow level trap Ea, an energy $\Delta E1$ needed to remove trapped charges is relatively small, and thus charges may easily move to the tunnel insulation layer 121c or the blocking layer 121a. On the other hand, in the case of the deep level trap Eb, an energy $\Delta E2$ needed to remove trapped charges is relatively high, and thus it is relatively difficult for charges to move. Therefore, when the number of deep level traps Eb in the charge storage layer 121b is relatively large, charge loss may be reduced or prevented.

FIG. 5 is a diagram showing deep level trap densities according to doping elements according to an example embodiment of the inventive concept. In FIG. 5, "Ref" represents the deep level trap density of the charge storage layer 121b when a doping element is not included.

Referring to FIG. 5, when the deep level trap density of the charge storage layer 121b not including a doping element is 100%, the deep level trap densities in cases where the charge storage layer 121b includes La, Al, Ti, and Hf as a doping element are 132%, 178%, 146%, and 231%, respectively. As such, the deep level trap density of the charge storage layer 121b including a doping element is higher than the deep level trap density of the charge storage layer 121b not including the doping element, and thus the retention characteristics of semiconductor devices 100a and 100b (refer to FIG. 8) may be improved.

Referring to FIG. 1, the tunnel insulation layer 121c may be on the charge storage layer 121b.

In an example embodiment, the tunnel insulation layer 121c may include a doping element. The doping element may be, for example, at least one of Hf, Al, La, Zr, and Ti.

In an example embodiment, the tunnel insulation layer 121c may include at least one of hafnium oxide (HfO) and hafnium nitride (HfN). In an example embodiment, the tunnel insulation layer 121c may include at least one of HfSiN and HfSiON. In an example embodiment, when the tunnel insulation layer 121c includes HfSiN or HfSiON, the concentration of Hf may be from about 5% to about 20% of the concentration of all elements included in the tunnel insulation layer 121c. For example, when the tunnel insulation layer 121c includes HfSiON, the Hf concentration of the tunnel insulation layer 121c may be about 15% of the concentration of all elements.

In an example embodiment, the tunnel insulation layer 121c may include a plurality of first sub-layers and a plurality of second sub-layers alternating with each other. In this case, the first sub-layers may each include at least one of $Si_3N_4$ and $SiO_2$, and the second sub-layers may each include at least one of HfO and HfN. In an example embodiment, when the tunnel insulation layer 121c includes the first sub-layers and the second sub-layers alternating with each other, the Hf concentration of the tunnel insulation layer 121c may be from about 5% to about 20% of the concentration of all elements included in the tunnel insulation layer 121c. For example, the Hf concentration of the tunnel insulation layer 121c may be about 15% of the concentration of all elements.

In an example embodiment, the length of the tunnel insulation layer 121c in the first horizontal direction (X direction) may be from about 40 Å to about 80 Å. For example, the length of the tunnel insulation layer 121c in the first horizontal direction (X direction) may be about 60 Å. The tunnel insulation layer 121c may tunnel charges into the charge storage layer 121b through FN tunneling.

The channel layer 123 may be on the tunnel insulation layer 121c. The channel layer 123 may include polycrystalline Si or a semiconductor material like polycrystalline Si, wherein the semiconductor material may be an undoped material or a material including a p-type impurity or an n-type impurity. The channel layer 123 may be positioned on a straight line in the first horizontal direction (X direction) and may be connected to different bit lines according to arrangements of a wiring structure thereabove. Also, a portion of the channel layer 123 may be a dummy channel not connected to a bit line.

Unlike as shown in FIG. 1, the channel layer 123 may include a plurality of layers.

The channel pad 125 may contact the channel layer 123 and the channel insulation layer 127. In some embodiments, the channel pad 125 may further contact the blocking layer 121a, the charge storage layer 121b, and the tunnel insulation layer 121c. The channel pad 125 may include a semiconductor material like Si, Ge, or Si—Ge, a metal like tungsten (W), Ti, Al, Cu, gold (Au), and silver (Ag), a metal nitride like TiN or tantalum nitride (TaN), or a conductive material like a combination thereof. In some embodiments, the channel pad 125 may include polysilicon.

The inside of the channel layer 123 may be filled with the channel insulation layer 127. The channel insulation layer 127 may include, for example, an insulating material like $SiO_2$ or SiON. Although FIG. 1 shows that the inside of the channel insulation layer 127 is completely filled with the channel layer 123, the inventive concept is not limited thereto, and the inside of the channel layer 123 may not be completely filled.

The insulation layers 131 may be arranged apart from the substrate 110 in the vertical direction (Z direction). The insulation layers 131 may surround portions of sidewalls of the channel structures 120. The insulation layers 131 may extend in parallel with one another in the second horizontal direction (Y direction). Lengths of the insulation layers 131 in the vertical direction (Z direction) may not be the same. For example, lengths of some of the insulation layers 131 in the vertical direction (Z direction) may be greater than lengths of the other insulation layers 131 in the vertical direction (Z direction). The insulation layers 131 may include, for example, an insulating material like $SiO_2$ or SiN.

The gate electrodes 140 may be arranged between the insulation layers 131. The gate electrodes 140 may surround portions of sidewalls of the channel structures 120. The gate electrodes 140 may extend in parallel with one another in the second horizontal direction (Y direction). Lengths of the gate electrodes 140 in the vertical direction (Z direction) may not be the same. For example, lengths of some of the gate electrodes 140 in the vertical direction (Z direction) may be greater than lengths of the other gate electrodes 140 in the vertical direction (Z direction). The gate electrodes 140 may form gates of a ground select transistor, a plurality of memory cells, and a string select transistor, respectively. The gate electrodes 140 may extend to form a word line, a string select line, and a ground select line, and the word line may be connected in common to adjacent memory cell strings of a certain unit arranged in the first horizontal direction (X direction) and the second horizontal direction (Y direction). The gate electrodes 140 may include a metal, e.g., W. However, the inventive concept is not limited thereto, and the gate electrodes 140 may further include polycrystalline Si or a metal silicide material.

The device isolation layer 150 may be between the channel structures 120 to isolate the channel structures 120. The device isolation layer 150 may be on the substrate 110 in the vertical direction (Z direction). The device isolation layer 150 may include, for example, an insulating material like $SiO_2$ or SiN.

Bit line contact pads 160 may be arranged on the channel structures 120. In this case, sidewalls of the bit line contact pads 160 may be surrounded by the topmost of the insulation layers 131. In an example embodiment, unlike as shown in FIG. 1, sidewalls of the bit line contact pads 160 may be surrounded by the tunnel insulation layer 121c, the charge storage layer 121b, and the blocking layer 121a. In this case, the top surfaces of the bit line contact pads 160 may contact the insulation layers 131.

FIGS. 6A to 6J are schematic cross-sectional views of a method of manufacturing a semiconductor device according to an example embodiment of the inventive concept. FIG. 7 is a diagram showing a change in concentration of a doping element due to heat treatment according to an example embodiment of the inventive concept.

Figure 6A:
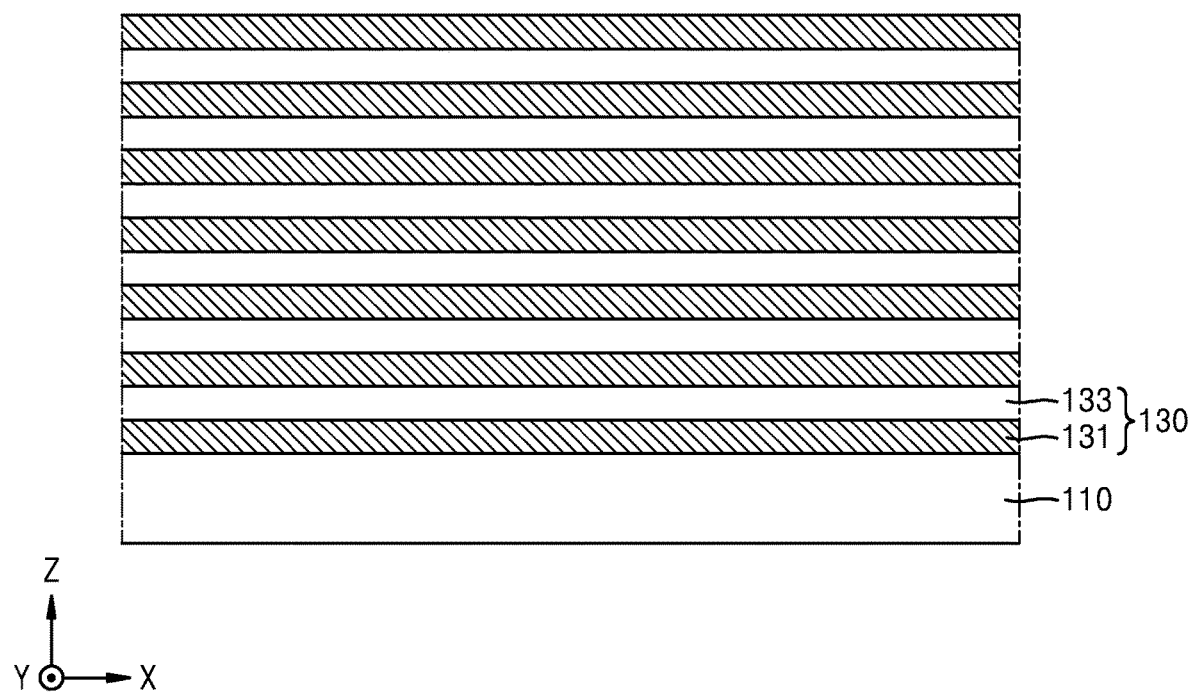
FIGS. 6A to 6J are cross-sectional views of a method of manufacturing a semiconductor device, according to an example embodiment of the inventive concept.

Referring to FIG. 6A, a mold structure 130 in which the insulation layers 131 and a plurality of sacrificial layers 133 are alternately and repeatedly stacked on the substrate 110 may be formed. The sacrificial layers 133 may be replaced with the gate electrodes 140 through a later process to be described later. The sacrificial layers 133 may include a material that may be etched with etch selectivity with respect to the insulation layers 131. For example, the insulation layers 131 may include at least one of $SiO_2$ and SiN, and the sacrificial layers 133 may include at least one of Si, $SiO_2$, SiC, and SiN and may include a material different from that of the insulation layers 131. Thicknesses and numbers of the insulation layers 131 and the sacrificial layers 133 may be variously changed from those shown in the drawings. The insulation layers 131 and the sacrificial layers 133 may be formed through, for example, an atomic layer deposition process or a chemical vapor deposition process.

Figure 6B:
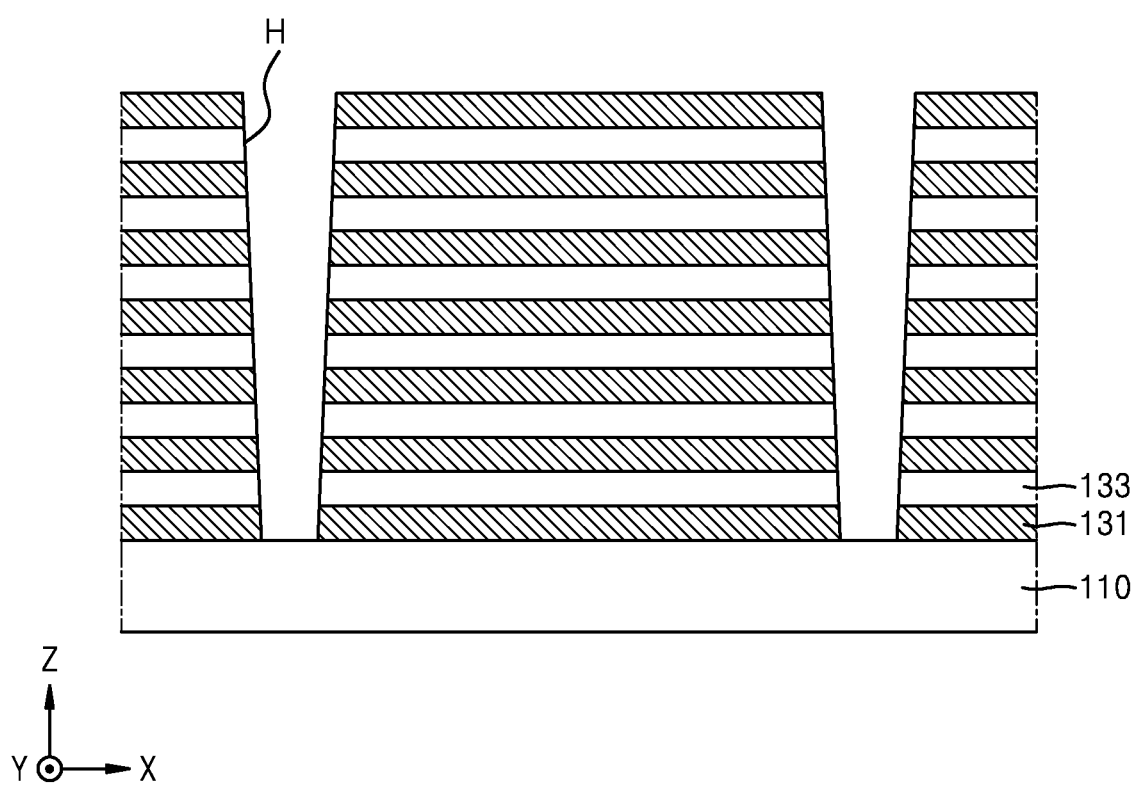

Referring to FIG. 6B, a plurality of channel holes H extending through the mold structure 130 may be formed. The channel holes H may be formed apart from one another in the first horizontal direction (X direction). The channel hole H may be formed by using, for example, a hard mask. In other words, a hard mask exposing only the shape of the channel holes H may be formed on the mold structure 130, and dry etching may be performed thereon to form the channel holes H. However, the inventive concept is not limited thereto, and for example, an amorphous carbon layer (ACL) may be used, and dry etching may be performed thereon to form the channel holes H. The sidewall of the channel hole H may have a vertical profile, but is not limited thereto. For example, since the etch rate of the mold structure 130 becomes weaker in a direction away from an exposed portion thereof, the sidewall of the channel hole H may have a tapered shape.

Figure 6C:
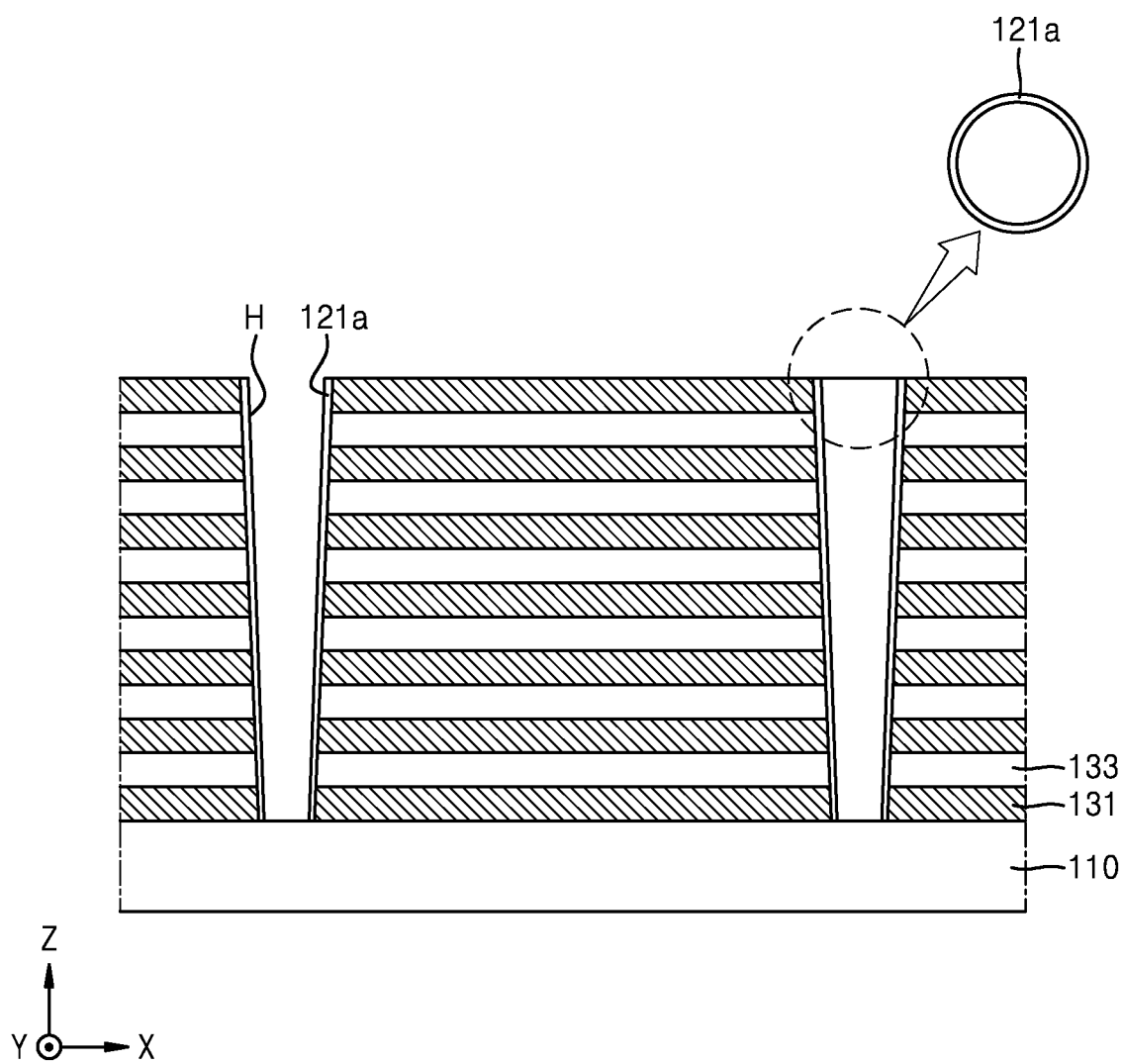

Referring to FIG. 6C, the blocking layer 121a may be formed in the channel hole H. The blocking layer 121a may be formed to cover the inner wall of the channel hole H and the top surface of the substrate 110. The blocking layer 121a may be formed through, for example, a chemical vapor deposition process or an atomic layer deposition process.

Figure 6D:
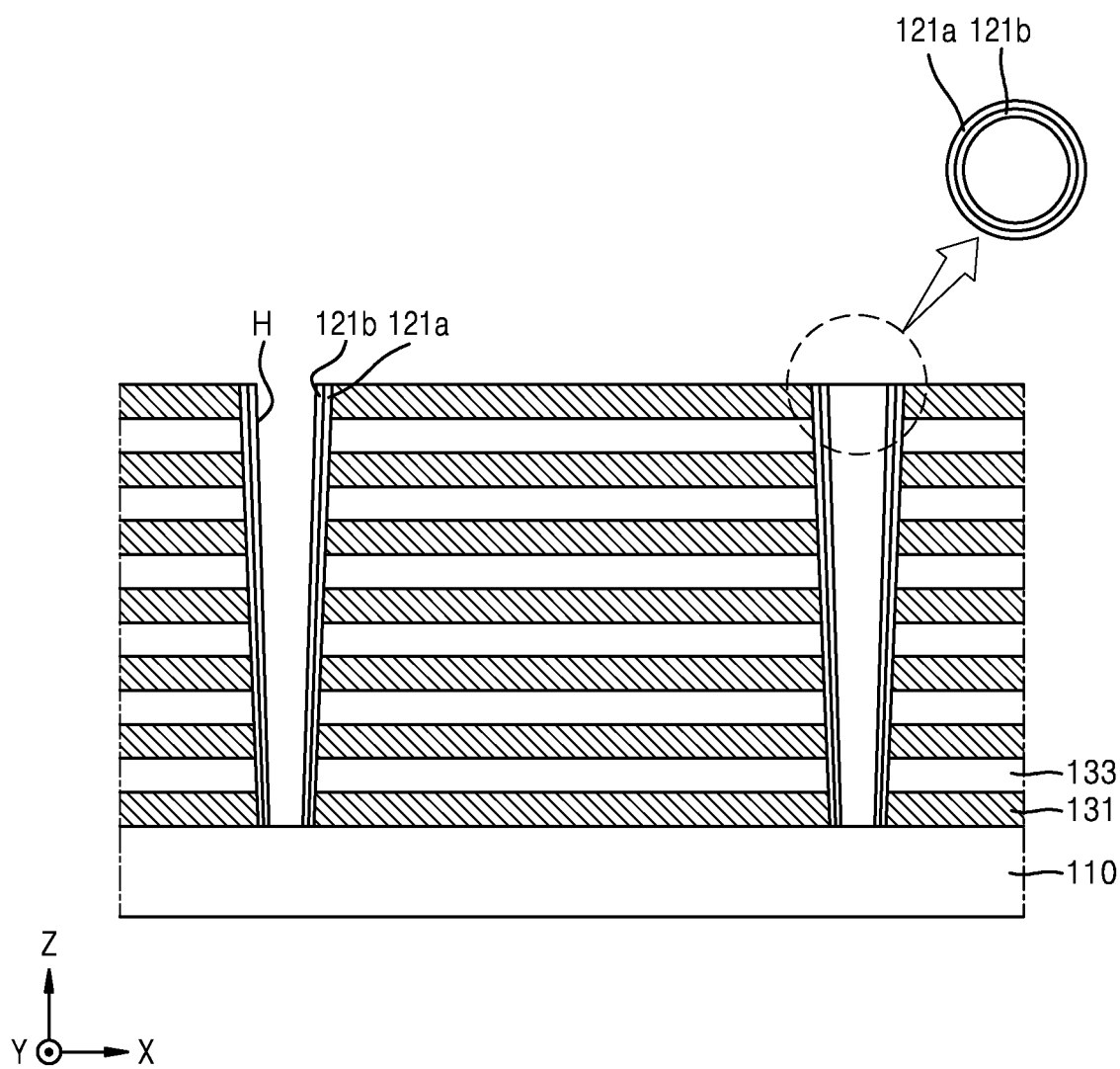

Referring to FIG. 6D, the charge storage layer 121b may be formed on the inner wall of the blocking layer 121a. The charge storage layer 121b may be formed to cover the inner wall of the channel hole H and the top surface of the substrate 110. The charge storage layer 121b may be formed through, for example, a chemical vapor deposition process or an atomic layer deposition process. In an example embodiment, the charge storage layer 121b may include SiN. In this case, the charge storage layer 121b does not include a doping element.

Figure 6E:
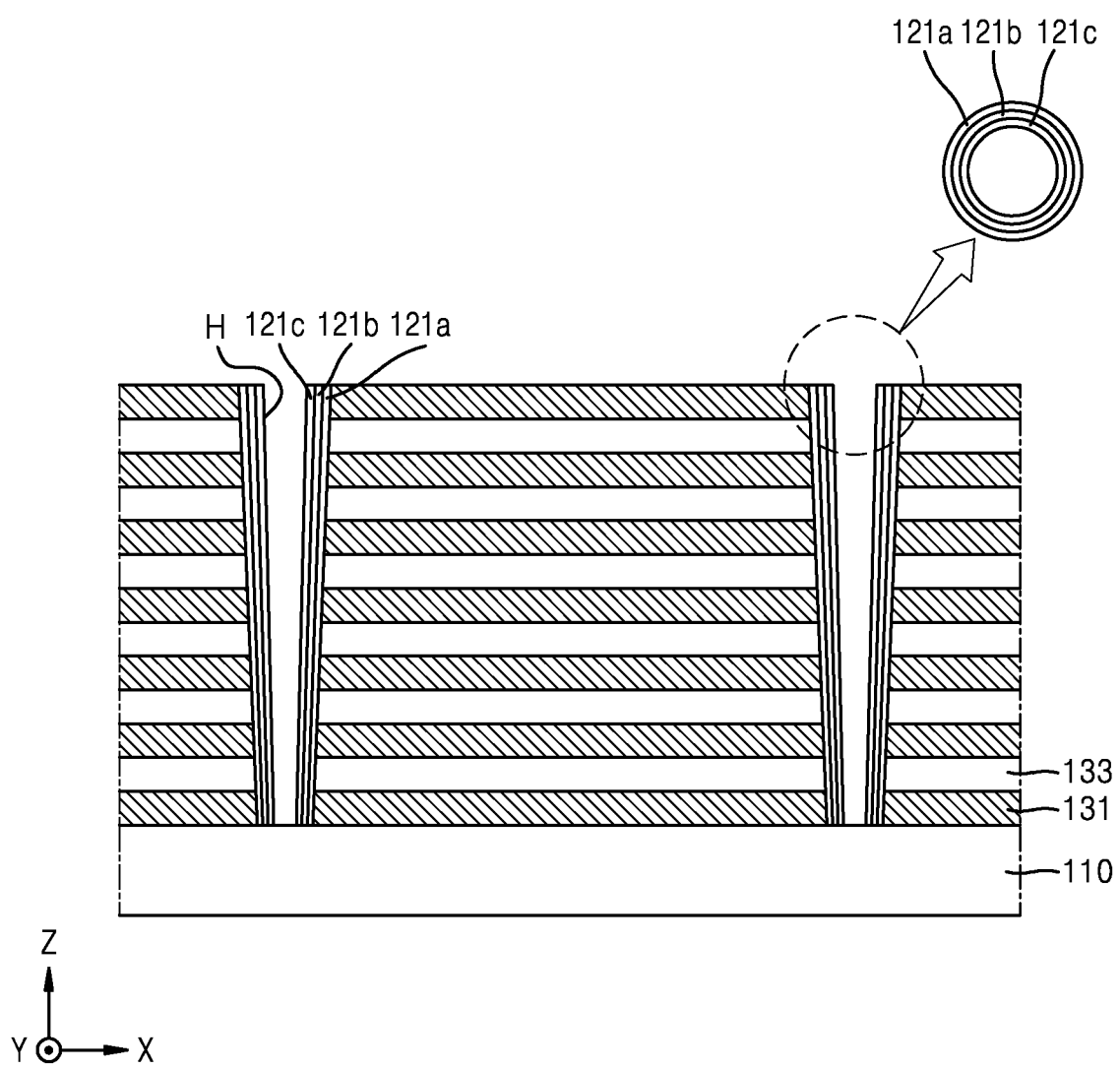

Referring to FIG. 6E, the tunnel insulation layer 121c including a doping element may be formed on the inner wall of the charge storage layer 121b. The tunnel insulation layer 121c may be formed to cover the inner wall of the channel hole H and the top surface of the substrate 110. In an example embodiment, the tunnel insulation layer 121c may be formed through an atomic layer deposition process, but the inventive concept is not limited thereto.

In an example embodiment, the tunnel insulation layer 121c may be deposited as a single layer including at least one of HfO and HfN. In an example embodiment, the tunnel insulation layer 121c may be deposited as a single layer including at least one of HfSiN and HfSiON.

In an example embodiment, in the tunnel insulation layer 121c, a plurality of first sub-layers and a plurality of second sub-layers may be alternately deposited, wherein the first sub-layer may include at least one of SiN and $SiO_2$ and the second sub-layer may include at least one of HfO and HfN. However, the inventive concept is not limited thereto, and, for example, the tunnel insulation layer 121c may include a doping element like La, Zr, Al, or Ti.

Referring to FIG. 7, by performing heat treatment, the doping element included in the tunnel insulation layer 121c may be diffused into the charge storage layer 121b. In an example embodiment, performing the heat treatment may be an annealing process using nitrogen gas. In an example embodiment, the temperature of the annealing process may be from about 800° C. to about 1100° C. For example, the temperature of the annealing process may be from about 820° C. to about 950° C. or may be about 850° C. In an example embodiment, the time of the annealing process may be from about 30 minutes to about 90 minutes. For example, the time of the annealing process may be about 60 minutes.

Unlike in the inventive concept, in the case of forming a charge storage layer including a doping element by alternately depositing SiN and at least one material from among HfO, hafnium oxynitride, and HfN, during the process, carbon contained in a Hf precursor may not be completely removed and may remain in the charge storage layer. As a result, there may be a problem that the retention characteristic of the semiconductor device is deteriorated. Also, due to the absence of a Hf precursor that may be used at high temperatures, the cross-deposition process of a charge storage layer needs to be done by using two chambers. Therefore, the process time is increased and the process is complicated.

On the other hand, when a charge storage layer including a doping element is formed through diffusion due to a heat treatment, carbon does not remain in the charge storage layer, because a Hf precursor is not used. Therefore, the problem of deterioration of the retention characteristic of a semiconductor device is reduced or does not occur. Also, since two chambers are not used to form a charge storage layer including a doping element, the process time may be reduced and the process may be simplified. Therefore, the charge storage layer including a doping element may be formed using a single chamber.

Figure 6F:
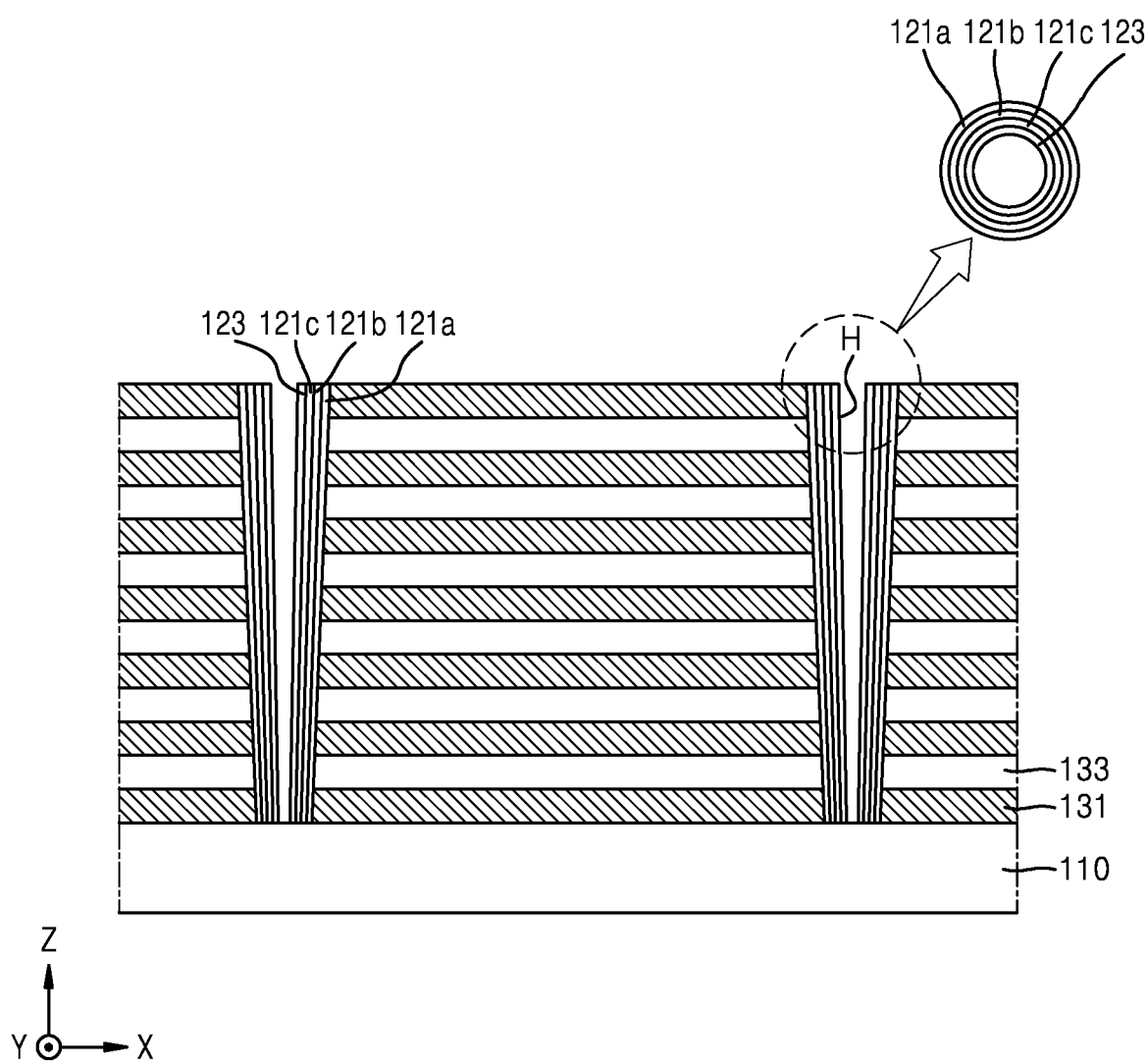
Figure 6G:
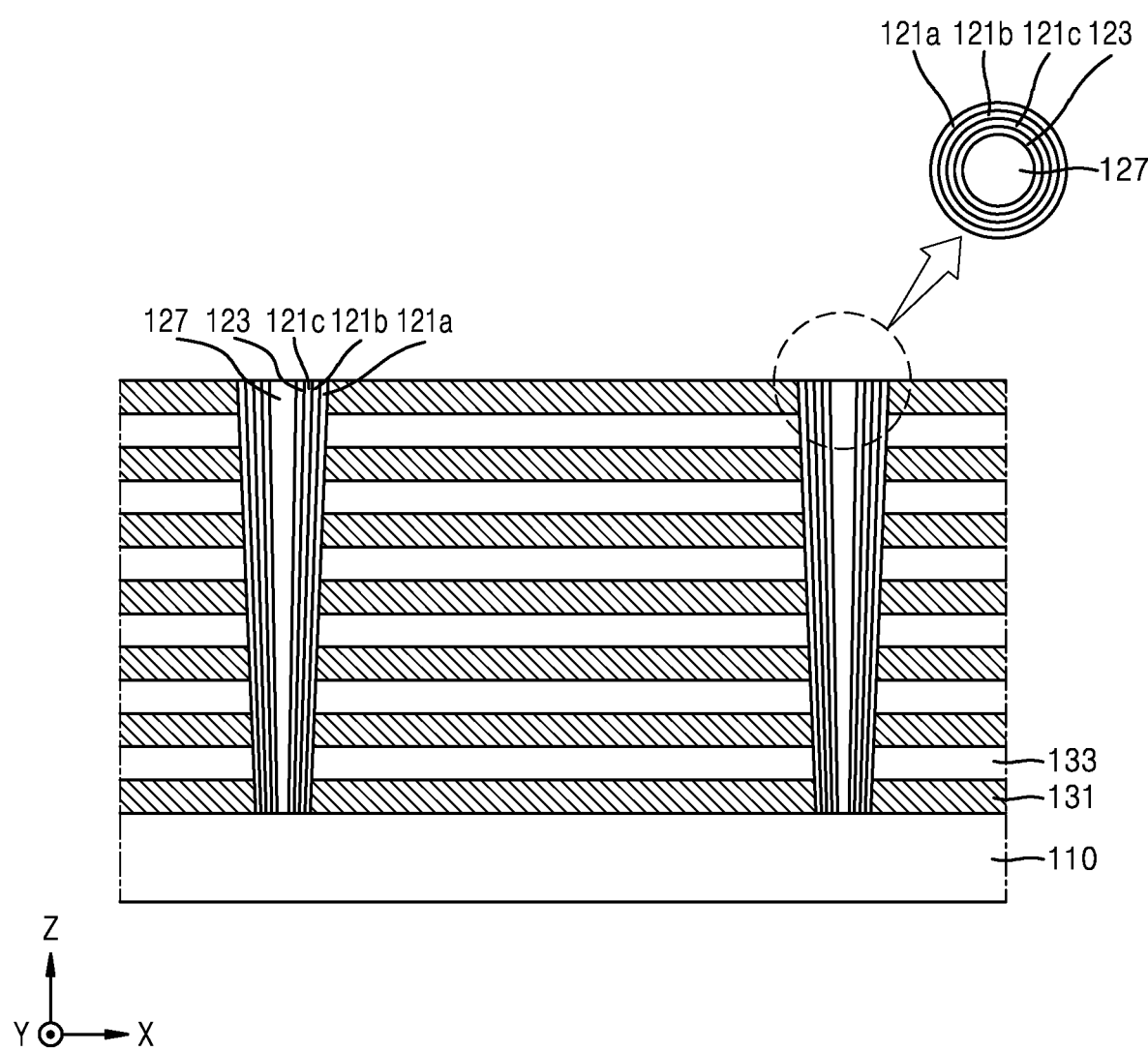

Referring to FIGS. 6F and 6G, the channel layer 123 may be formed on the inner wall of the tunnel insulation layer 121c and the channel insulation layer 127 may be formed on the channel layer 123. The channel layer 123 and the channel insulation layer 127 may be formed through, for example, an atomic layer deposition process or a chemical vapor deposition process. Although not shown in FIGS. 6F and 6G, next, the blocking layer 121a, the charge storage layer 121b, the tunnel insulation layer 121c, the channel layer 123, and the channel insulation layer 127 in an end portion of the channel hole H are removed, and the channel pad 125 may be formed in the end portion of the channel hole H.

Figure 6H:
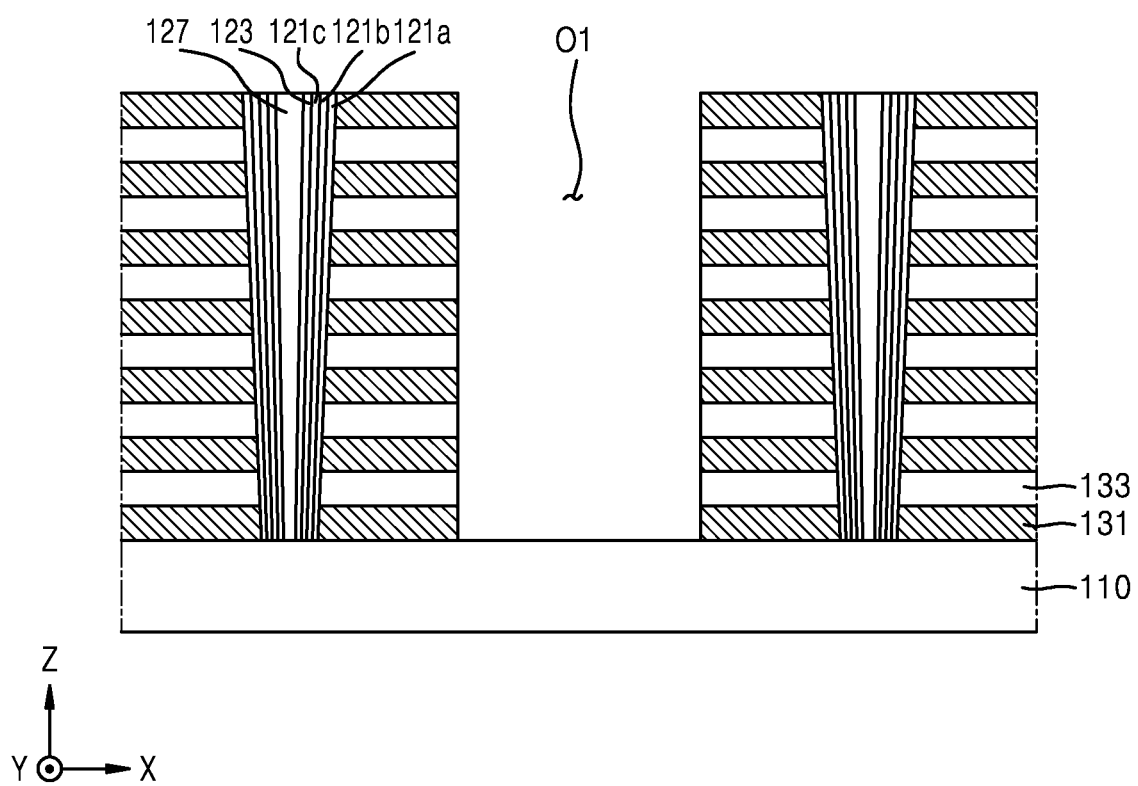

Referring to FIG. 6H, an opening O1 may be formed to separate the mold structure 130 in which the sacrificial layers 133 and the insulation layers 131 are stacked at a certain interval. The opening O1 may be formed by forming a mask through a photolithography process and etching a region where the mask is not formed. The mask may be, for example, a photoresist or a spin on hard mask (SOH), but is not limited thereto. For example, the mask may be an amorphous carbon film. The mask may be removed later through an ashing process or a stripping process. Sidewalls of the sacrificial layers 133, sidewalls of the insulation layers 131, and a portion of the top surface of the substrate 110 may be exposed by the opening O1. The length of the opening O1 in the vertical direction (Z direction) may be identical to the length of the mold structure 130 in the vertical direction (Z direction), but is not limited thereto.

Figure 6I:
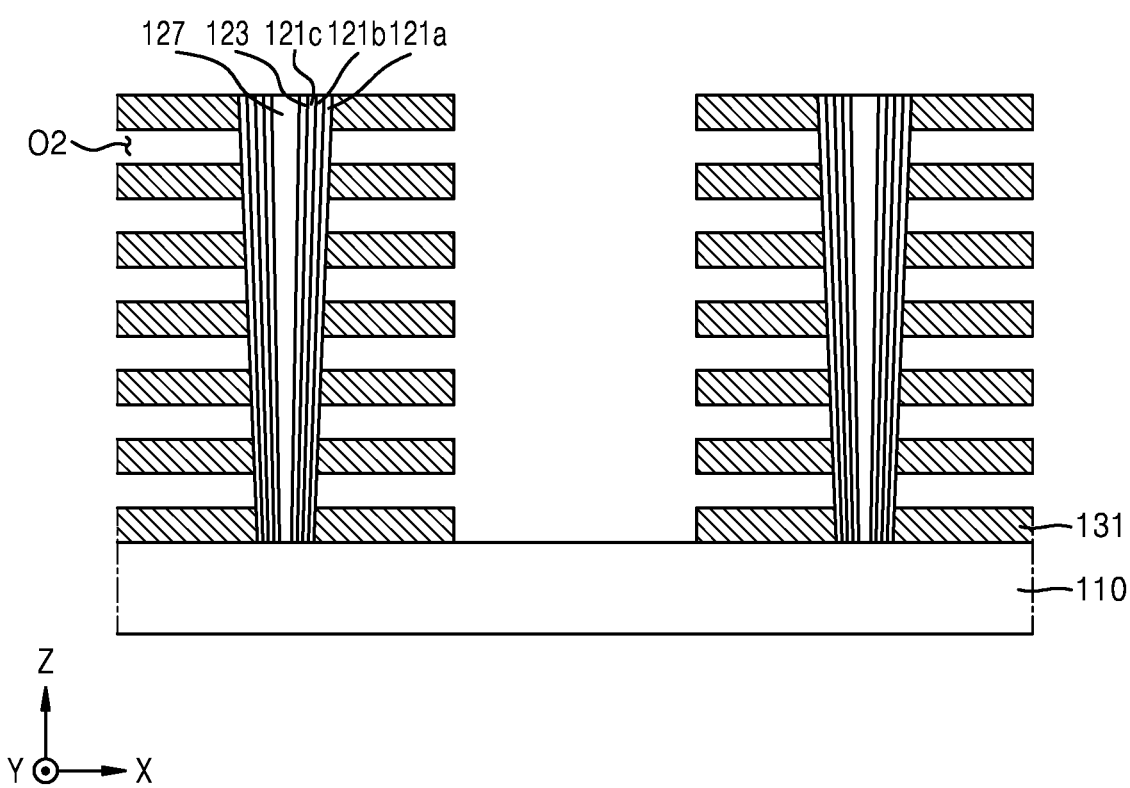

Referring to FIG. 6I, the sacrificial layers 133 exposed by the opening O1 may be removed. The sacrificial layers 133 may be selectively removed with respect to the insulation layers 131 through, for example, wet etching. As the sacrificial layers 133 are removed, side openings O2 exposing portions of the outer wall of the blocking layer 121a may be formed.

Figure 6J:
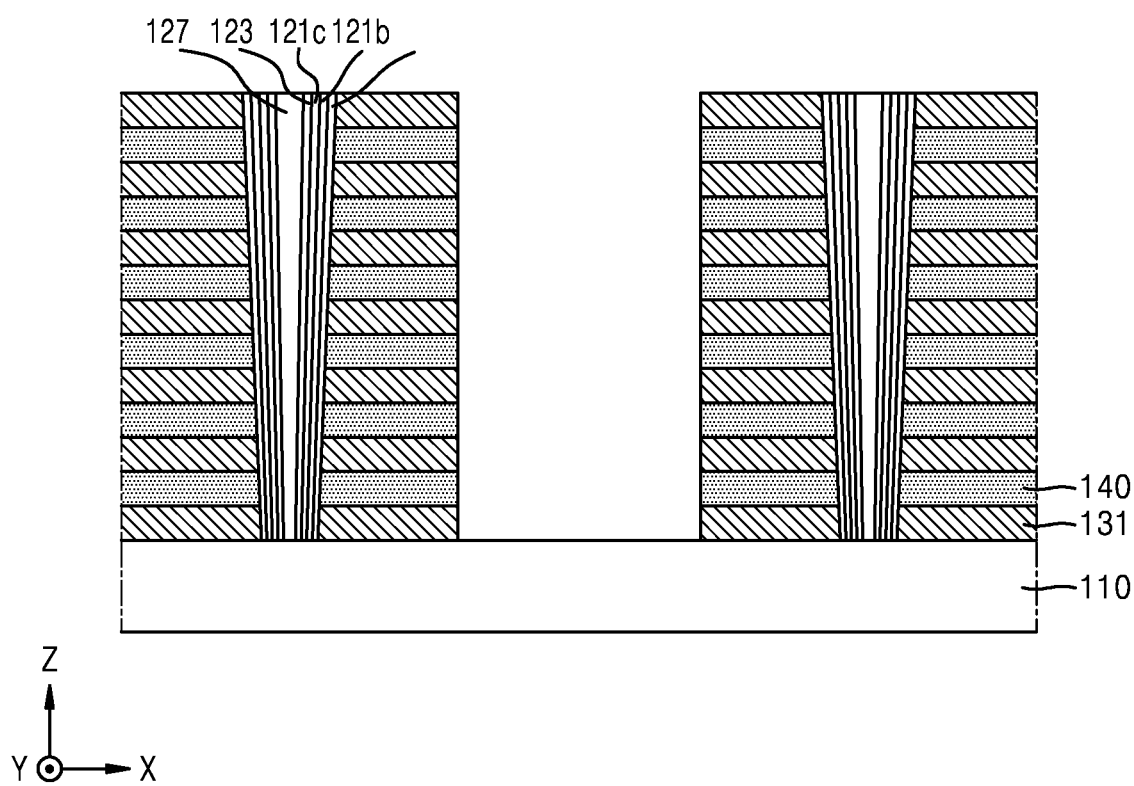

Referring to FIGS. 6I and 6J, the gate electrodes 140 may be formed in the side openings O2 formed by removing the sacrificial layers 133. As shown in FIG. 6J, the gate electrodes 140 formed in the opening O1 may be removed through an additional process, such that the gate electrodes 140 are arranged only in the side openings O2 and are not arranged in the opening O1.

After the gate electrodes 140 are formed, the device isolation layer 150 may be formed in the opening O1 through an additional process.

Figure 8:
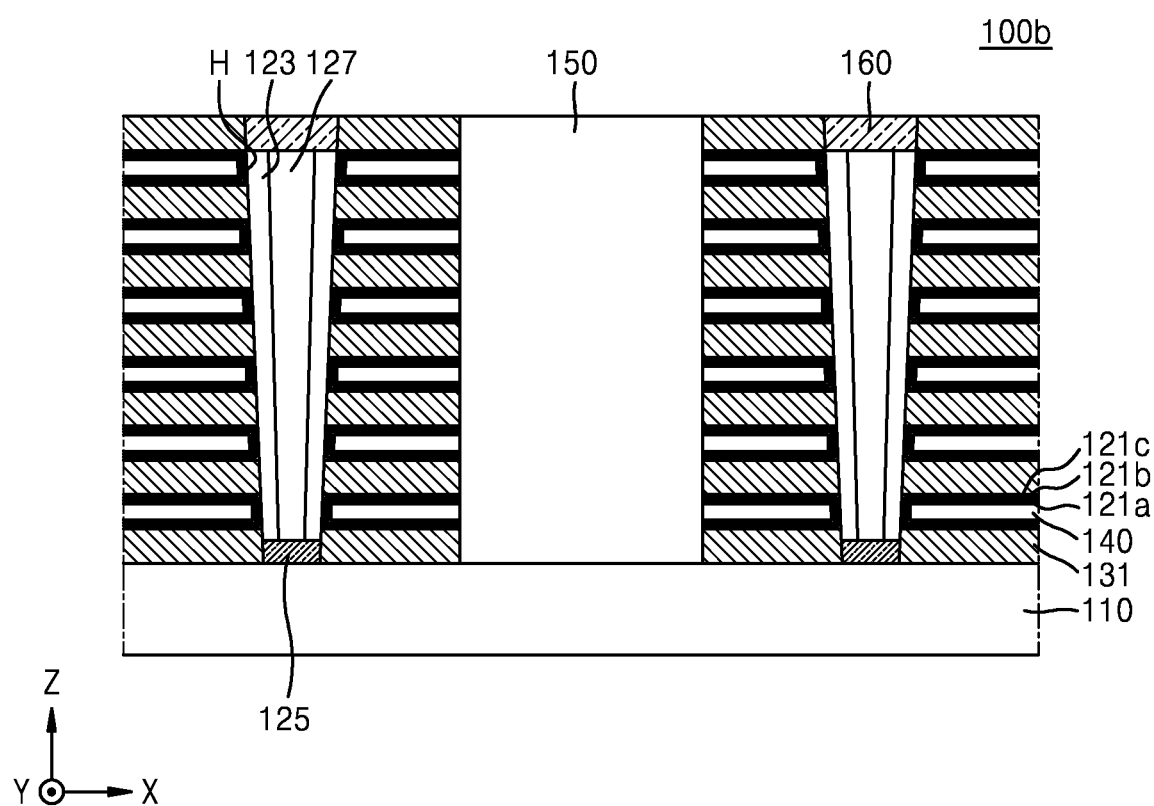
FIG. 8 is a cross-sectional view of a semiconductor device according to an example embodiment of the inventive concept.

FIG. 8 is a schematic cross-sectional view of a semiconductor device according to an example embodiment of the inventive concept. FIGS. 9A to 9F are schematic cross-sectional views of a method of manufacturing a semiconductor device according to an example embodiment of the inventive concept. Hereinafter, descriptions will be given based on differences from the semiconductor device and the method of manufacturing the semiconductor device described above with reference to FIGS. 1 and 6A to 6J.

Referring to FIG. 8, the blocking layer 121a, the charge storage layer 121b, and the tunnel insulation layer 121c may be located outside the channel hole H. The blocking layer 121a, the charge storage layer 121b, and the tunnel insulation layer 121c may be located between the insulation layers 131 and the gate electrodes 140 and between the channel layer 123 and the gate electrodes 140.

Figure 9A:
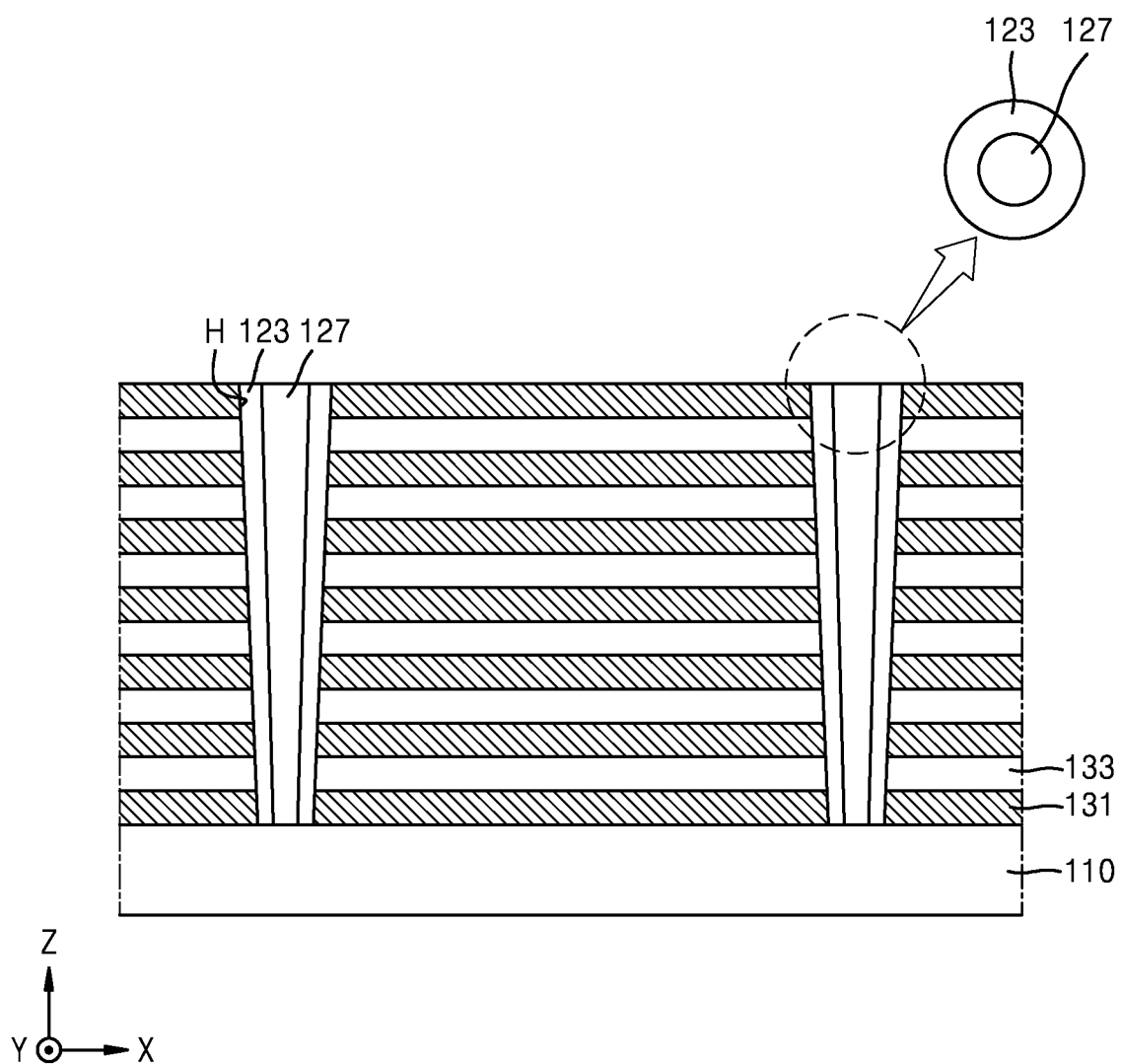
FIGS. 9A to 9F are cross-sectional views of a method of manufacturing a semiconductor device, according to an example embodiment of the inventive concept.

Referring to FIG. 9A, the mold structure 130 in which the insulation layers 131 and the sacrificial layers 133 are alternately and repeatedly stacked may be formed, the channel holes H extending through the mold structure 130 may be formed, and the channel layer 123 and the channel insulation layer 127 may be formed in the channel hole H. The channel layer 123 may be formed on the sidewall of the channel hole H, and the channel insulation layer 127 may be formed on the channel layer 123. The channel layer 123 may cover the sidewall and the bottom surface of the channel hole H.

Figure 9B:
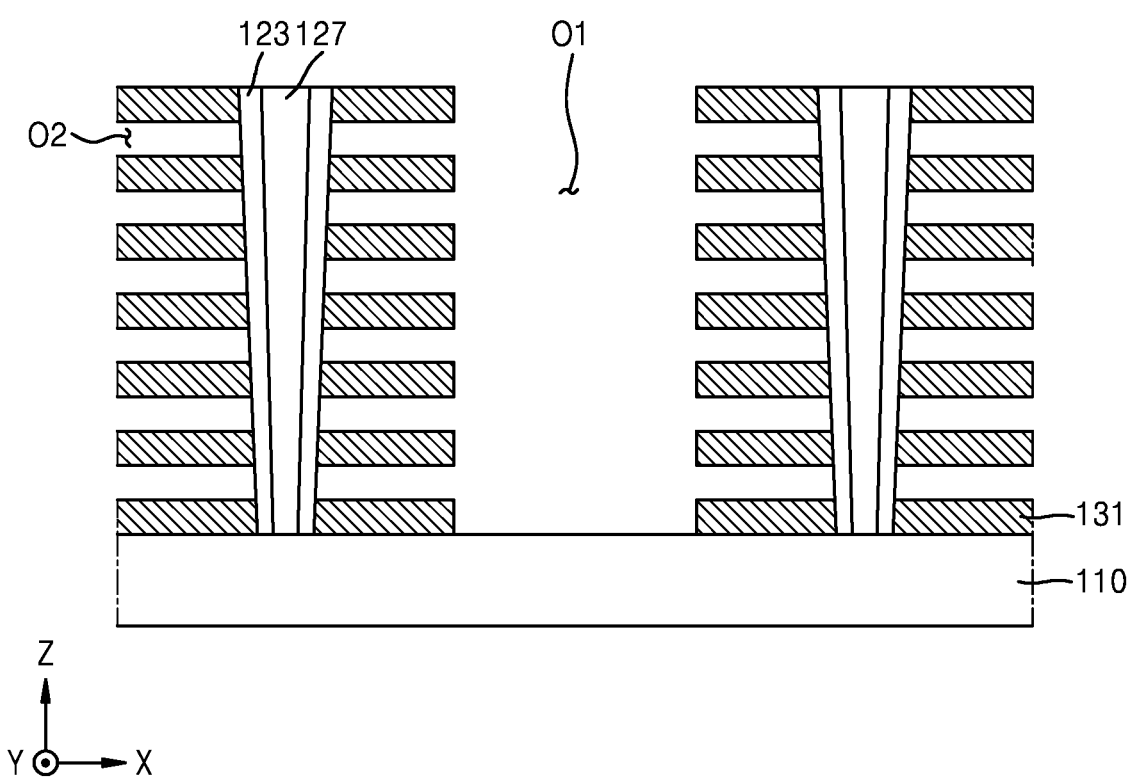

Referring to FIG. 9B, the opening O1 that separates the mold structure 130 in which the sacrificial layers 133 and the insulation layers 131 are stacked at a regular interval is formed, and the sacrificial layers 133 exposed by the opening O1 may be removed. As the sacrificial layers 133 may be removed, the side openings O2 exposing portions of the outer wall of the channel layer 123 may be formed.

Figure 9C:
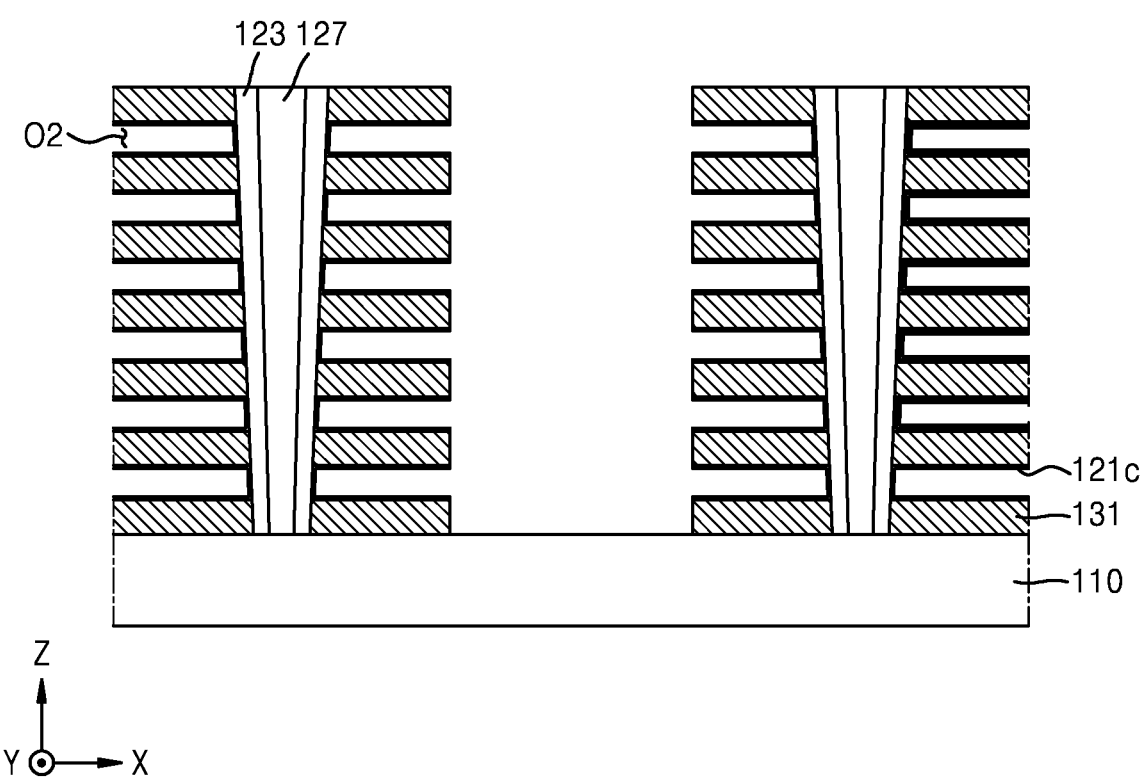

Referring to FIGS. 9B and 9C, the tunnel insulation layer 121c including a doping element may be formed in the side openings O2 formed by removing the sacrificial layers 133. In an example embodiment, the thickness of the tunnel insulation layer 121c may be from about 40 Å to about 80 Å, e.g., about 60 Å.

Figure 9D:
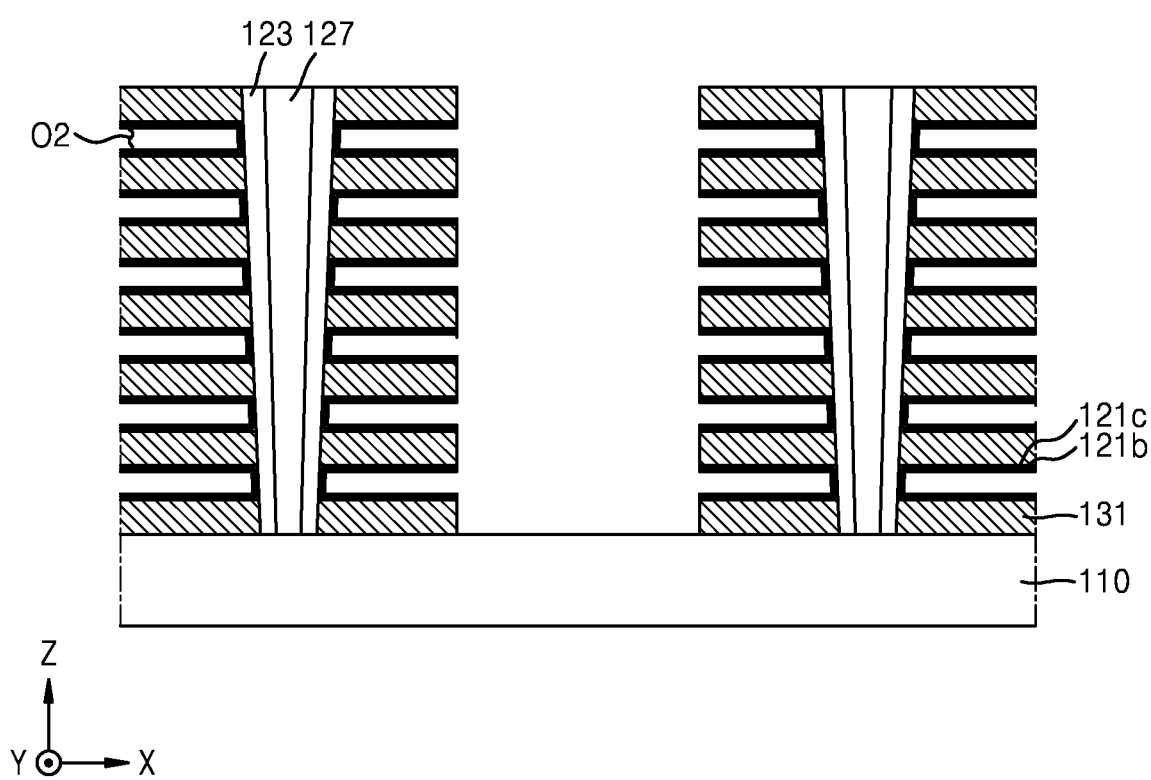

Referring to FIG. 9D, the charge storage layer 121b may be formed on the tunnel insulation layer 121c. In an example embodiment, the thickness of the charge storage layer may be from about 40 Å to about 80 Å, e.g., about 60 Å. After the charge storage layer 121b is formed, by performing heat treatment, the doping element included in the tunnel insulation layer 121c may be diffused into the charge storage layer 121b.

Figure 9E:
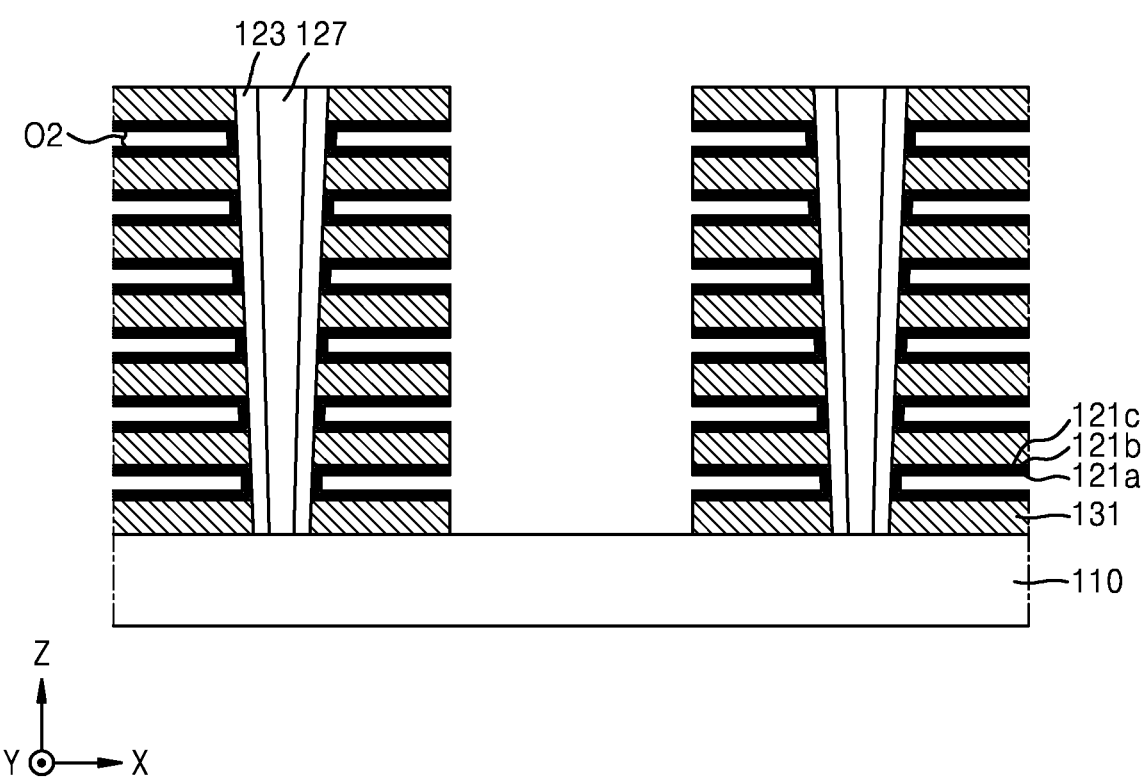

Referring to FIG. 9E, the blocking layer 121a may be formed on the charge storage layer 121b. In an example embodiment, the method may further include an operation of performing a second heat treatment after the blocking layer 121a is formed. For example, the second heat treatment may be performed at about 1100° C. for about 1 second, but is not limited thereto. The doping element included in the tunnel insulation layer 121c may be further diffused into the charge storage layer 121b through the second heat treatment, and thus the blocking layer 121a may be crystallized.

Figure 9F:
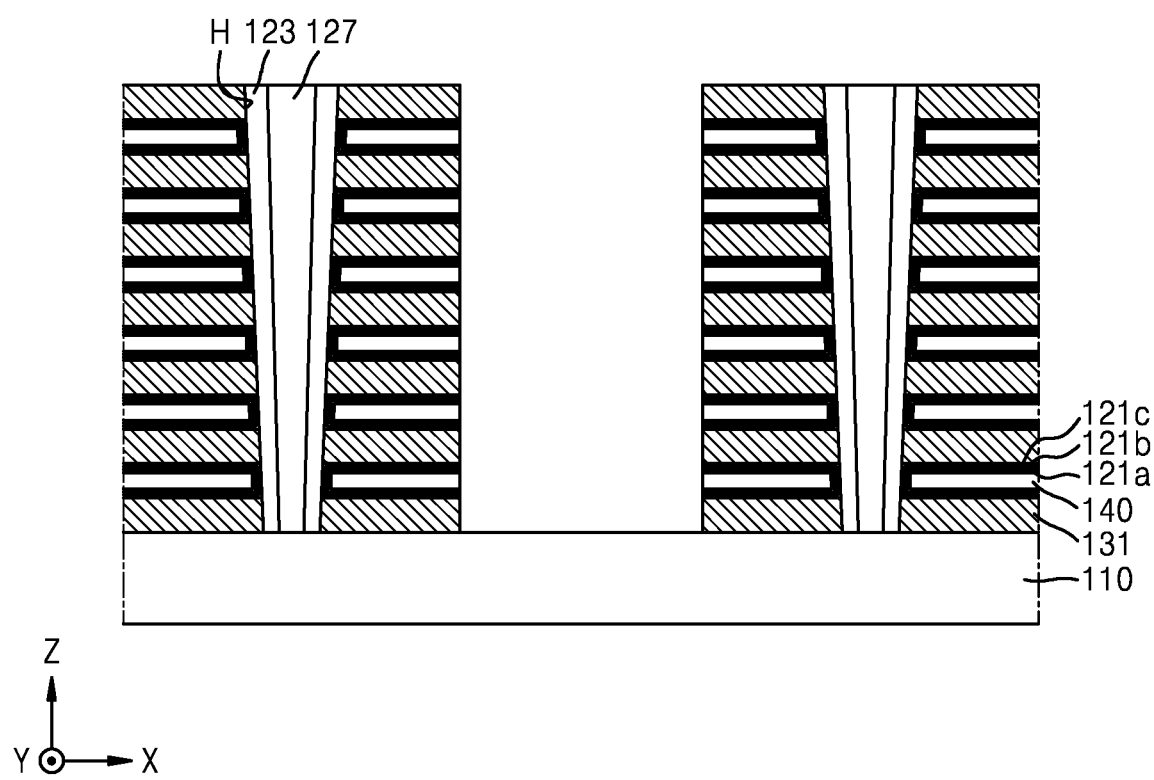

Referring to FIGS. 9E and 9F, the gate electrodes 140 may be formed in the side openings O2 in the blocking layer 121a. The gate electrodes 140 formed in the opening O1 may be removed through an additional process, such that the gate electrodes 140 are arranged only in the side openings O2 and are not arranged in the opening O1.

Although not shown in FIG. 9F, after the gate electrodes 140 are formed, the device isolation layer 150 may be formed in the opening O1 through an additional process.

Figure 10:
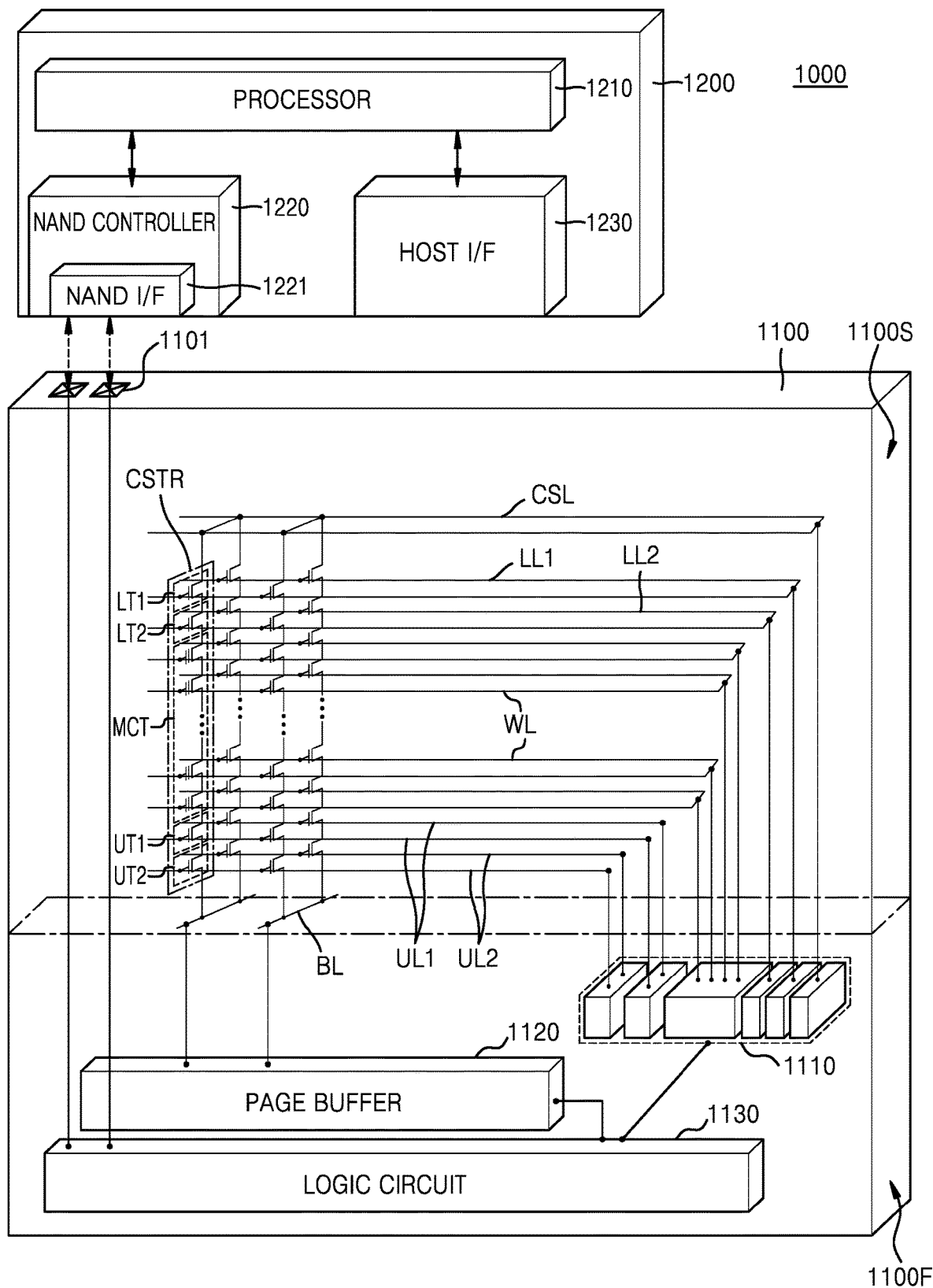
FIG. 10 is a diagram schematically showing a memory system including a semiconductor device, according to example embodiments of the inventive concept.

FIG. 10 is a diagram schematically showing a memory system 1000 including a semiconductor device according to example embodiments of the inventive concept.

Referring to FIG. 10, the memory system 1000 may include one or more memory devices 1100 and a memory controller 1200 electrically connected to the memory devices 1100. The memory system 1000 may be, for example, a solid state drive (SSD) device, a universal serial bus (USB), a computing system, a medical device, or a communication device including at least one memory device 1100.

A memory device 1100 may be a non-volatile memory device. For example, the memory device 1100 may be a NAND flash memory device including one or a combination of semiconductor devices 100a and 100b described above with reference to FIGS. 1, 2, and 8. The memory device 1100 may include a first structure 1100F and a second structure 1100S on the first structure 1100F.

The second structure 1100S may include bit lines BL, a common source line CSL, a plurality of word lines WL, first and second string select lines UL1 and UL2, first and second ground select lines LL1 and LL2, and a plurality of memory cell strings CSTR between the bit lines BL and the common source line CSL. The channel structure 120 and the gate electrodes 140 shown in FIGS. 1 and 8 may constitute the memory cell strings CSTR.

In the second structure 1100S, the memory cell strings CSTR may each include ground select transistors LT1 and LT2 adjacent to the common source line CSL, string select transistors UT1 and UT2 adjacent to the bit lines BL, and a plurality of memory cell transistors MCT between the ground select transistors LT1 and LT2 and the string select transistors UT1 and UT2. The number of ground select transistors LT1 and LT2 and the number of string select transistors UT1 and UT2 may be variously changed according to embodiments. The channel structure 120 and one gate electrode from among the gate electrodes 140 shown in FIGS. 1 and 8 may constitute one of transistors LT1, LT2, UT1, UT2, and MCT.

In example embodiments, the first and second ground select lines LL1 and LL2 may be connected to gate electrodes of the ground select transistors LT1 and LT2 therebelow, respectively. A word line WL may be connected to a gate electrode of a memory cell transistor MCT. The first and second string select lines UL1 and UL2 may be connected to gate electrodes of the string select transistors UT1 and UT2, respectively.

The common source line CSL, the ground select lines LL1 and LL2, the word lines WL, and the first and second string select lines UL1 and UL2 may be connected to a row decoder 1110. The bit lines BL may be electrically connected to a page buffer 1120.

The memory device 1100 may communicate with the memory controller 1200 through input/output pads 1101 electrically connected to a logic circuit 1130. The input/output pads 1101 may be electrically connected to the logic circuit 1130.

The memory controller 1200 may include a processor 1210, a NAND controller 1220, and a host interface 1230. In some embodiments, the memory system 1000 may include a plurality of memory devices 1100. In this case, the memory controller 1200 may control the memory devices 1100.

The processor 1210 may control the overall operation of the memory system 1000 including the memory controller 1200. The processor 1210 may operate according to a certain firmware and may access the memory device 1100 by controlling the NAND controller 1220. The NAND controller 1220 may include a NAND interface 1221 that handles communication with the memory device 1100. Control commands for controlling the memory device 1100, data to be written to the memory cell transistors MCT of the memory device 1100, and data to be read from the memory cell transistors MCT of the memory device 1100 may be transmitted through the NAND interface 1221. The host interface 1230 may provide the function for communication between the memory system 1000 and an external host. When a control command is received from an external host through the host interface 1230, the processor 1210 may control the memory device 1100 in response to the control command.

Figure 11:
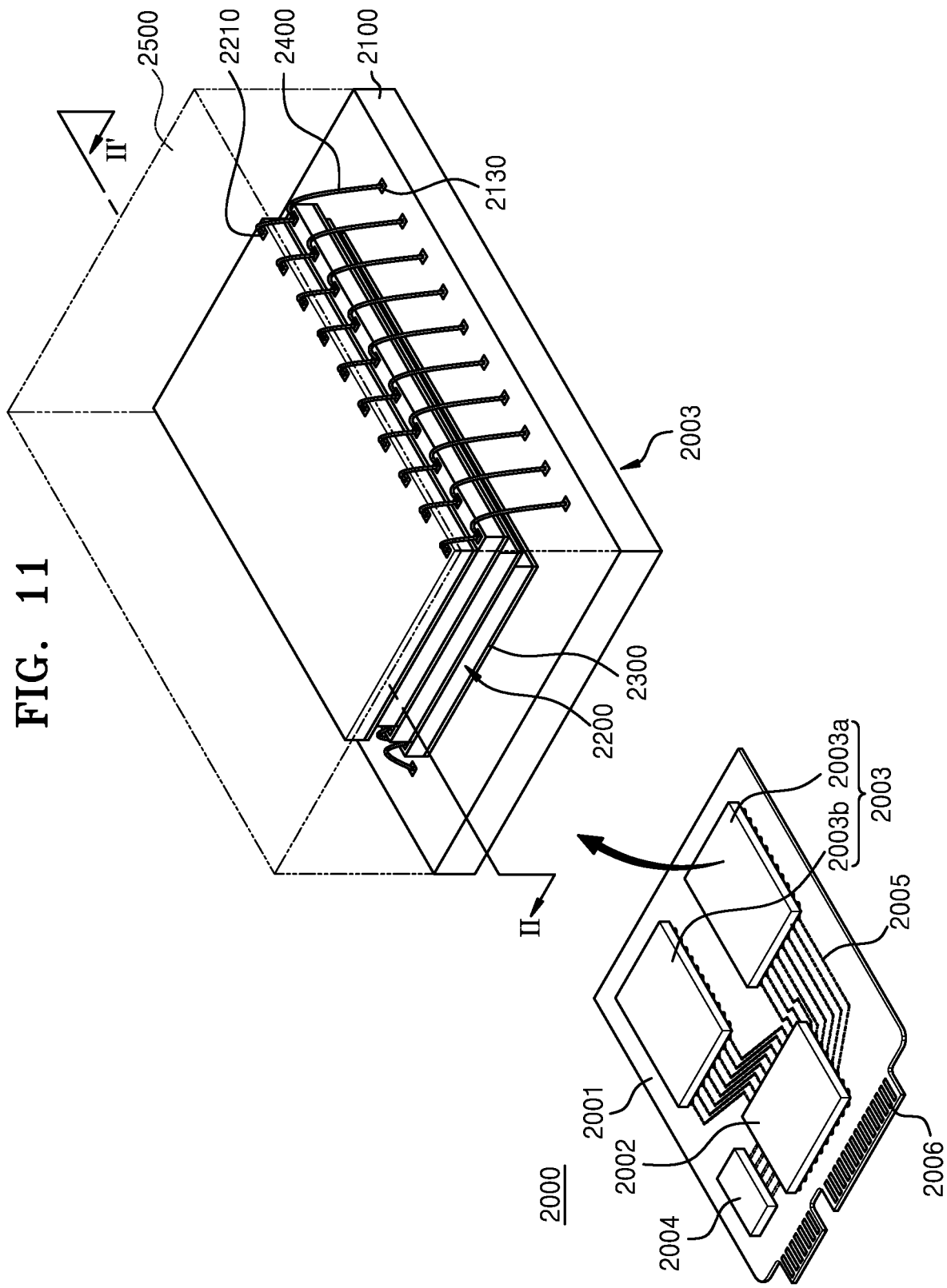
FIG. 11 is a schematic perspective view of a memory system including a semiconductor device, according to example embodiments of the inventive concept.

FIG. 11 is a schematic perspective view of a memory system 2000 including a semiconductor device according to example embodiments of the inventive concept.

Referring to FIG. 11, the memory system 2000 according to an example embodiment of the inventive concept may include a main substrate 2001 and a memory controller 2002, one or more semiconductor packages 2003, and a DRAM 2004 that are mounted on the main substrate 2001. The semiconductor package 2003 and the DRAM 2004 may be connected to the memory controller 2002 by a plurality of wiring patterns 2005 formed on the main substrate 2001.

The main substrate 2001 may include a connector 2006 including a plurality of pins coupled to an external host. The number and arrangement of the pins of the connector 2006 may vary according to a communication interface between the memory system 2000 and the external host. In example embodiments, the memory system 2000 may communicate with an external host according to any one of interfaces including a universal serial bus (USB), peripheral component interconnect express (PCI-Express), serial advanced technology attachment (SATA), M-Phy for universal flash storage (UFS), etc. In example embodiments, the memory system 2000 may operate by power supplied from an external host through the connector 2006. The memory system 2000 may further include a power management integrated circuit (PMIC) that distributes power supplied from the external host to the memory controller 2002 and the semiconductor package 2003.

The memory controller 2002 may write data to or read data from the semiconductor package 2003 and may improve the operating speed of the memory system 2000.

The DRAM 2004 may be a buffer memory for mitigating a speed difference between the semiconductor package 2003, which is a data storage space, and an external host. The DRAM 2004 included in the memory system 2000 may also operate as a type of cache memory and may provide a space for temporarily storing data in a control operation for the semiconductor package 2003. When the DRAM 2004 is included in the memory system 2000, the memory controller 2002 may further include a DRAM controller for controlling the DRAM 2004 in addition to the NAND controller for controlling the semiconductor package 2003.

The semiconductor package 2003 may include first and second semiconductor packages 2003a and 2003b spaced apart from each other. The first and second semiconductor packages 2003a and 2003b may each be a semiconductor package including a plurality of semiconductor chips 2200. The first and second semiconductor packages 2003a and 2003b may each include a package substrate 2100, the semiconductor chips 2200 on the package substrate 2100, an adhesive layer 2300 on the bottom surface of each of the semiconductor chips 2200, a connection structure 2400 electrically connecting the semiconductor chips 2200 and the package substrate 2100, and a molding layer 2500 covering the semiconductor chips 2200 and the connection structure 2400 on the package substrate 2100.

The package substrate 2100 may be a printed circuit board including a plurality of package upper pads 2130. The semiconductor chips 2200 may each include input/output pads 2210. The semiconductor chips 2200 may each include at least one of the semiconductor devices 100a and 100b described above with reference to FIGS. 1, 2, and 8.

In example embodiments, the connection structure 2400 may be a bonding wire electrically connecting the input/output pad 2210 and the package upper pad 2130. Therefore, in the first and second semiconductor packages 2003a and 2003b, the semiconductor chips 2200 may be electrically connected to one another through bonding wires and may be electrically connected to the package upper pads 2130 of the package substrate 2100. In example embodiments, in the first and second semiconductor packages 2003a and 2003b, the semiconductor chips 2200 may be connected to one another through a connection structure including through silicon vias (TSVs) instead of the connection structure 2400 including bonding wires.

In example embodiments, the memory controller 2002 and the semiconductor chips 2200 may be included in one package. In an example embodiment, the memory controller 2002 and the semiconductor chips 2200 may be mounted on a separate interposer substrate different from the main substrate 2001 and the memory controller 2002 and the semiconductor chips 2200 may be connected to each other through wires formed on the interposer substrate.

Figure 12:
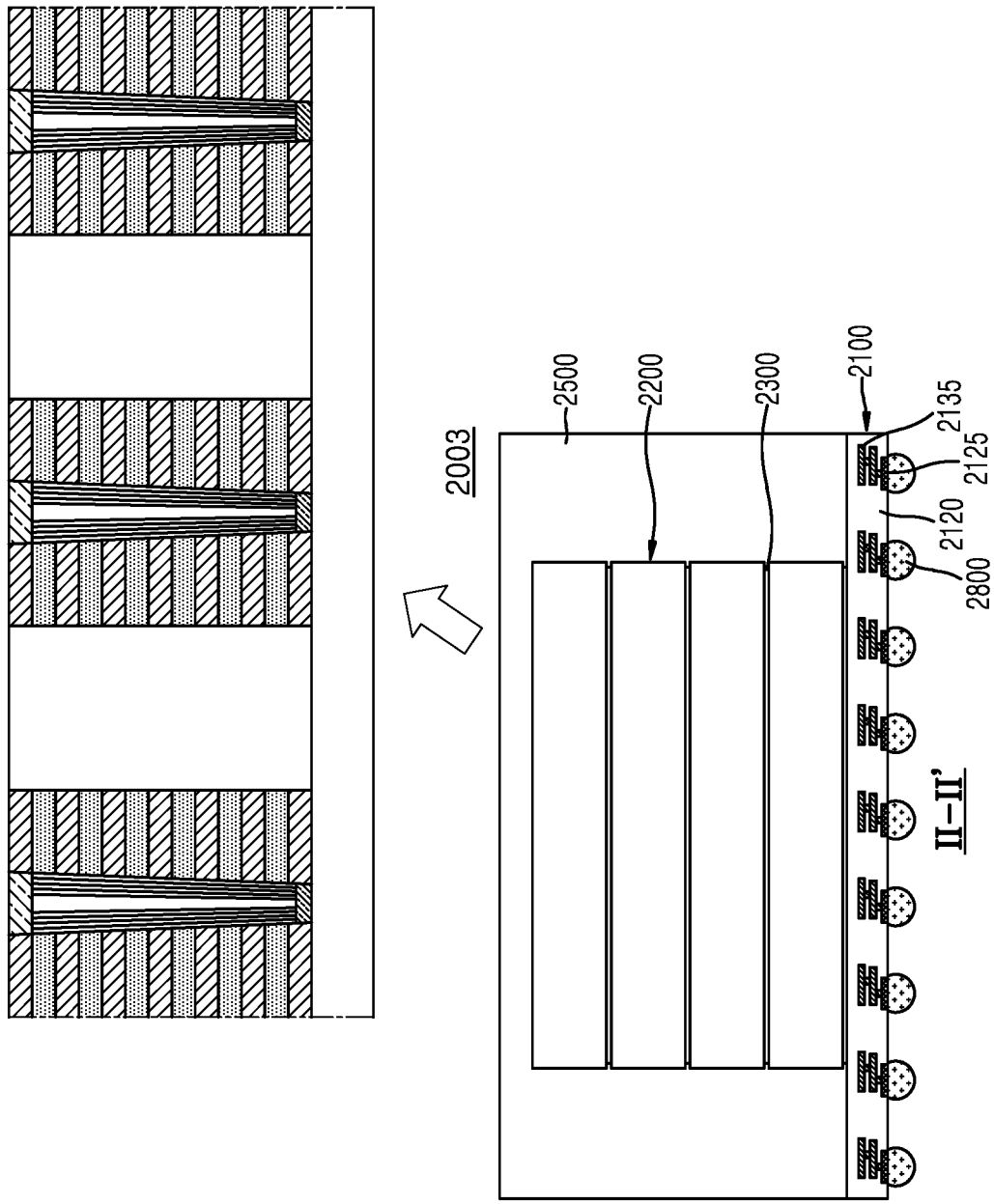
FIG. 12 is a schematic cross-sectional view of semiconductor packages according to example embodiments of the inventive concept.

FIG. 12 is a schematic cross-sectional view of semiconductor packages 2003 according to example embodiments of the inventive concept.

Referring to FIG. 12, in a semiconductor package 2003, the package substrate 2100 may be a printed circuit board. The package substrate 2100 may include a package substrate body 2120, a plurality of package upper pads 2130 (refer to FIG. 11) arranged on the top surface of the package substrate body 2120, a plurality of package lower pads 2125 arranged or exposed on the bottom surface of the package substrate body 2120, and a plurality of internal wires 2135 electrically connecting the package upper pads 2130 (refer to FIG. 11) and the package lower pads 2125 inside the package substrate body 2120. As shown in FIG. 11, the package upper pads 2130 may be electrically connected to the connection structures 2400. As shown in FIG. 12, the package lower pads 2125 may be connected to the wiring patterns 2005 on the main substrate 2001 of the memory system 2000 shown in FIG. 11 through a plurality of conductive bumps 2800. The semiconductor chips 2200 may each include at least one of the semiconductor devices 100a and 100b described above with reference to FIGS. 1, 2, and 8.

While the inventive concept has been particularly shown and described with reference to embodiments thereof, it will be understood that various changes in form and details may be made therein without departing from the scope of the following claims.

What is claimed is:

1. A method of manufacturing a semiconductor device, the method comprising:
   forming a mold structure comprising insulation layers and sacrificial layers alternately and repeatedly stacked on a substrate;
   forming a channel hole extending through the mold structure;
   forming a blocking layer in the channel hole;
   forming a charge storage layer on the blocking layer;
   forming a tunnel insulation layer comprising a doping element on the charge storage layer;
   performing a heat treatment to diffuse the doping element from the tunnel insulation layer to the charge storage layer; and
   forming a channel layer on the tunnel insulation layer.

2. The method of claim 1,
   wherein the doping element comprises at least one of Hf, Al, La, Zr, and Ti.

3. The method of claim 1,
   wherein, after the performing of the heat treatment, a concentration of the doping element in the charge storage layer is highest at a first side of the charge storage layer in contact with the tunnel insulation layer and decreases toward an opposing second side of the charge storage layer.

4. The method of claim 1,
   wherein the tunnel insulation layer is formed through an atomic layer deposition process.

5. The method of claim 1,
   wherein the tunnel insulation layer comprises at least one of HfO and HfN or one of HfSiON and HfSiN.

6. The method of claim 1,
   wherein the charge storage layer is free of carbon after performing the heat treatment.

7. The method of claim 6,
   wherein a Hf concentration of the tunnel insulation layer is at least 5% of a total amount of elements included in the tunnel insulation layer.

8. The method of claim 1,
   wherein the tunnel insulation layer comprises a plurality of first sub-layers and a plurality of second sub-layers alternating with each other, and
   each of the first sub-layers comprises at least one of SiN and $SiO_2$, and each of the second sub-layers comprises at least one of HfO and HfN.

9. The method of claim 8,
   wherein a Hf concentration of the tunnel insulation layer is at least 10% of a total amount of elements included in the tunnel insulation layer.

10. The method of claim 1,
    wherein the charge storage layer comprises SiN.

11. The method of claim 1,
    wherein a concentration of the doping element in the charge storage layer after performing the heat treatment is 5% or lower of a total amount of elements included in the charge storage layer.

12. The method of claim 1,
    wherein the heat treatment is an annealing process using nitrogen gas.

13. The method of claim 12,
    wherein a temperature of the annealing process is from 800° C. to 1100° C.

14. The method of claim 12,
    wherein a duration of the annealing process is from 30 minutes to 90 minutes.

* * * * *